United States Patent
Chen et al.

(10) Patent No.: US 12,519,024 B2
(45) Date of Patent: Jan. 6, 2026

(54) PACKAGE STRUCTURE COMPRISING BUFFER LAYER FOR REDUCING THERMAL STRESS AND METHOD OF FORMING THE SAME

(71) Applicant: Taiwan Semiconductor Manufacturing Company, Ltd., Hsinchu (TW)

(72) Inventors: Wei-Chih Chen, Taipei (TW); Chien-Hsun Lee, Hsin-chu County (TW); Chung-Shi Liu, Hsinchu (TW); Hao-Cheng Hou, Hsinchu (TW); Hung-Jui Kuo, Hsinchu (TW); Jung-Wei Cheng, Hsinchu (TW); Tsung-Ding Wang, Tainan (TW); Yu-Hsiang Hu, Hsinchu (TW); Sih-Hao Liao, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/604,502

(22) Filed: Mar. 14, 2024

(65) Prior Publication Data
US 2024/0222215 A1   Jul. 4, 2024

Related U.S. Application Data

(63) Continuation of application No. 17/849,737, filed on Jun. 27, 2022, now Pat. No. 11,961,777, which is a
(Continued)

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/568* (2013.01); *H01L 23/16* (2013.01);
(Continued)

(58) Field of Classification Search
None
See application file for complete search history.

(56) References Cited

U.S. PATENT DOCUMENTS 8,993,380 B2   3/2015   Hou et al.
9,281,254 B2   3/2016   Yu et al.
(Continued)

*Primary Examiner* — Daniel Whalen
(74) *Attorney, Agent, or Firm* — JCIPRNET

(57) ABSTRACT

A package structure and a method of forming the same are provided. The package structure includes a first die, a second die, a first encapsulant, and a buffer layer. The first die and the second die are disposed side by side. The first encapsulant encapsulates the first die and the second die. The second die includes a die stack encapsulated by a second encapsulant encapsulating a die stack. The buffer layer is disposed between the first encapsulant and the second encapsulant and covers at least a sidewall of the second die and disposed between the first encapsulant and the second encapsulant. The buffer layer has a Young's modulus less than a Young's modulus of the first encapsulant and a Young's modulus of the second encapsulant.

20 Claims, 28 Drawing Sheets

Related U.S. Application Data continuation of application No. 16/666,431, filed on Oct. 29, 2019, now Pat. No. 11,404,342.

(51) Int. Cl.
| | | |
|---|---|---|
| *H01L 23/16* | (2006.01) | |
| *H01L 23/538* | (2006.01) | |
| *H01L 25/00* | (2006.01) | |
| *H01L 25/065* | (2023.01) | |

(52) U.S. Cl.
CPC ...... *H01L 23/3135* (2013.01); *H01L 23/5383* (2013.01); *H01L 25/0652* (2013.01); *H01L 25/50* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,404,342 B2 * | 8/2022 | Chen ................. H01L 23/16 |
| 11,961,777 B2 * | 4/2024 | Chen ................. H01L 24/20 |
| 2014/0203429 A1 * | 7/2014 | Yu ................. H01L 24/19 257/737 |
| 2016/0013147 A1 * | 1/2016 | Cheng ................. H01L 24/19 438/109 |
| 2018/0254260 A1 * | 9/2018 | Wei ................. H01L 25/0652 |

\* cited by examiner

PACKAGE STRUCTURE COMPRISING BUFFER LAYER FOR REDUCING THERMAL STRESS AND METHOD OF FORMING THE SAME

CROSS-REFERENCE TO RELATED APPLICATION

This is a continuation application of and claims the priority benefit of U.S. application Ser. No. 17/849,737, filed on Jun. 27, 2022. The U.S. application Ser. No. 17/849,737 is a continuation application of and claims the priority benefit of U.S. application Ser. No. 16/666,431, filed on Oct. 29, 2019, now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

DETAILED DESCRIPTION

Figure 1A:
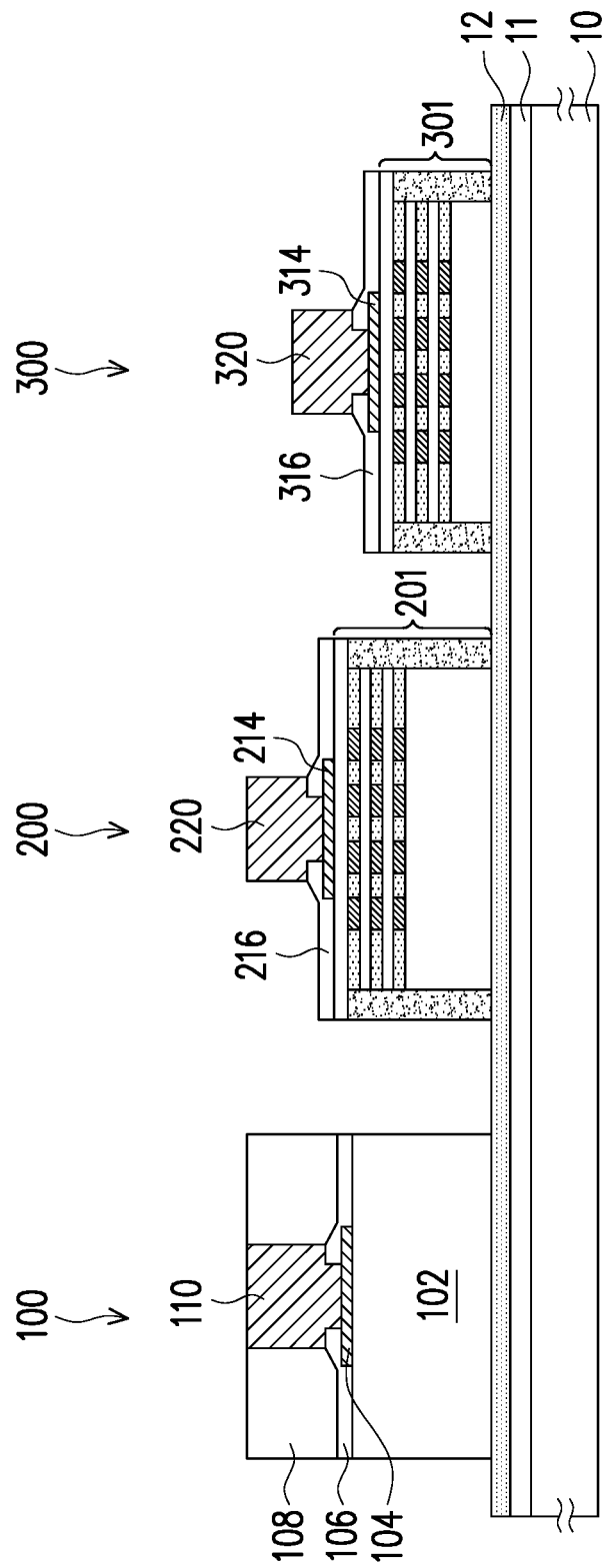
FIG. 1A to FIG. 1J are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
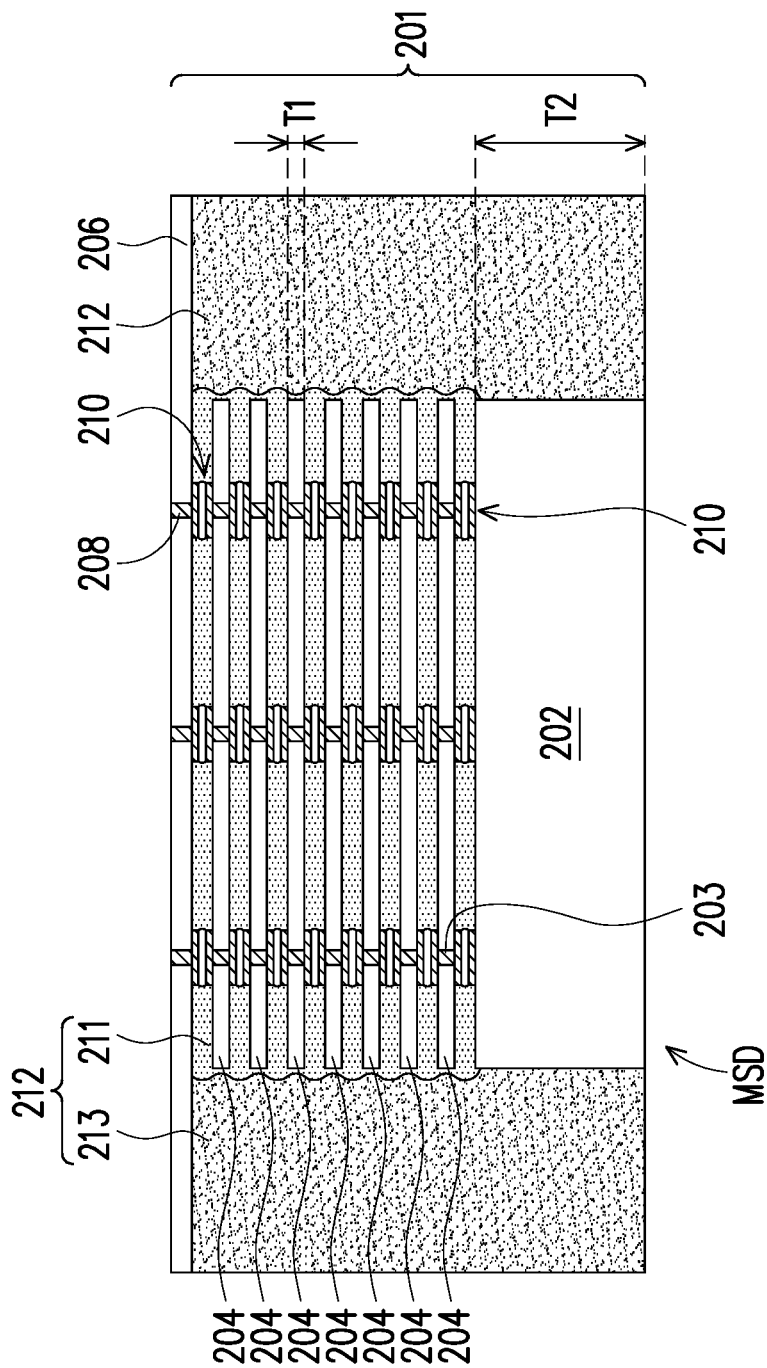
FIG. 2 is an enlarged schematic cross-sectional view illustrating a second die of FIG. 1A.
Figure 3:
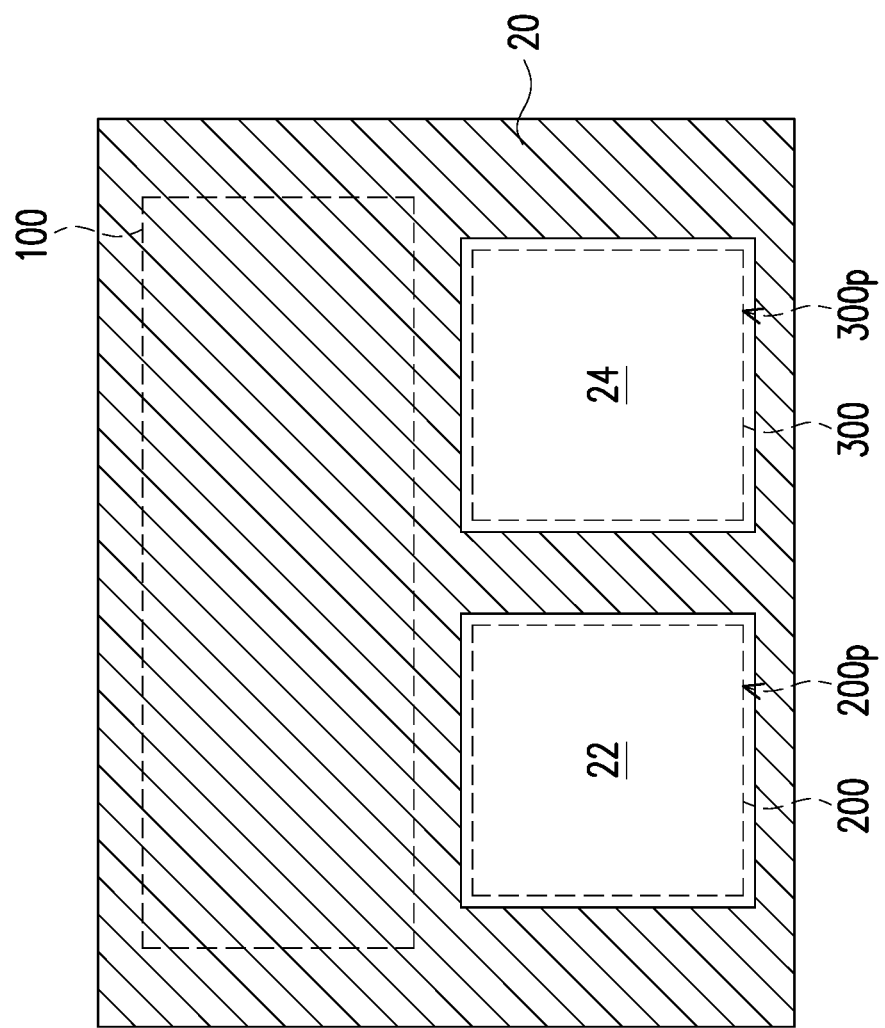
FIG. 3 is a schematic top view illustrating a mask of forming a buffer layer of FIG. 1C.

FIG. 1A to FIG. 1J are schematic cross-sectional views illustrating a method of forming a package structure according to a first embodiment of the disclosure. FIG. 2 is an enlarged schematic cross-sectional view illustrating a second die of FIG. 1A. FIG. 3 is a schematic top view illustrating a mask of forming a buffer layer of FIG. 1C.

Referring to FIG. 1A, a carrier 10 is provided. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

In some embodiments, a first die 100, a second die 200, and a third die 300 are attached or mounted side by side to the de-bonding layer 11 over the carrier 10 through an adhesive layer 12 such as a die attach film (DAF), silver paste, or the like. The first die 100, the second die 200, and the third die 300 may be the same type of dies or the different types of dies. Alternatively, the size of the first die 100, the second die 200, and the third die 300 may be the same or different. Herein, the term "size" is referred to the height, length, width, or area. For example, as shown in FIG. 1A, the height of the second die 200 is greater than the height of the third die 300.

Specifically, the first die 100 includes a substrate 102, a pad 104, a passivation layer 106, a connector 110 and a protection layer 108. In some embodiments, the substrate 102 is made of silicon or other semiconductor materials. Alternatively or additionally, the substrate 102 includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 102 is made of an alloy semiconductor such as silicon germanium, silicon germanium carbide, gallium arsenic phosphide, or gallium indium phosphide. Furthermore, the substrate 102 may be a semiconductor on insulator such as silicon on insulator (SOI) or silicon on sapphire.

The pad 104 may be a part of an interconnection structure (not shown) and electrically connected to the devices (not shown) formed on the substrate 102. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like. The passivation layer 106 is formed over the substrate 102 and covers a portion of the pad 104. A portion of the pad 104 is exposed by the passivation layer 106 and serves as an external connection of the first die 100. The passivation layer 106 includes an insulating material such as silicon oxide, silicon nitride, polymer, or a combination thereof. The polymer includes polybenzoxazole (PBO), polyimide (PI), benzocyclobutene (BCB), a combination thereof or the like, for example.

The protection layer 108 is optionally located over the passivation layer 106 and aside the connector 110 to cover the sidewalls of the connector 110. That is, the protection layer 108 may be included or not included in the first die 100. The protection layer 108 may be formed of a material the same as or different from that of the passivation layer 106.

The connector 110 is formed on and electrically connected to the pad 104 exposed by the passivation layer 106. The connector 110 is formed on and electrically connected to the pad 104 not covered by the passivation layer 106. The connector 110 includes solder bumps, gold bumps, copper bumps, copper posts, copper pillars, or the like. The cross section shape of the connector 110 may be T-shaped, square or rectangle, but the disclosure is not limited thereto. The sidewalls of the connector 110 may be straight or inclined. In some embodiments, the connector 110 includes a seed layer (e.g., a composite layer including titanium and copper) and a conductive post (e.g., a copper post). Although only one pad 104 and one connector 110 are illustrated in FIG. 1A, the number of the pad 104 and the connector 110 is not limited in this disclosure. In other embodiments, the number of the pad 104 and the connector 110 may be adjusted depending on actual design needs.

In some embodiments, the first die 100 may be any one of a system-on-chip (SoC) device, a memory device, or any other suitable types of devices. In some alternative embodiments, the first die 100 may respectively be an application-specific integrated circuit (ASIC) chip, an analog chip, a sensor chip, a wireless and radio frequency chip, a voltage regulator chip, a memory chip or the like.

As shown in FIG. 1A and FIG. 2, the second die 200 may include a memory die stack MSD, such as a high bandwidth memory (HBM) and/or a hybrid memory cube (HMC). In detail, as shown in FIG. 2, the second die 200 may include a main body 201. The main body 201 may include a bottom die 202 and a plurality of stacked memory dies 204. The stacked memory dies 204 may all be identical dies. Alternatively, the memory dies 204 may include dies of different types and/or structures. Each memory die 204 is connected to an overlying memory die 204 and/or an underlying memory die 204 by a plurality of connectors 210. The connectors 210 may be micro bumps, hybrid bonding structures, or other suitable connectors. The memory dies 204 may include through vias 203 that connect underlying connectors 210 to overlying connectors 210. In some embodiment, the memory dies 204 each have a thickness T1 in a range from about 46.5 µm to about 53.5 µm. The number of the memory dies 204 is not limited in this disclosure. In some alternative embodiments, the number of the memory dies 204 may be adjusted depending on actual design needs.

In some embodiments, the main body 201 may include one or more memory dies 204 connected to a logic die 206. The logic die 206 may include through vias 208 that connect a conductive feature of an interconnection region (not shown) to an underlying connector 210 and memory dies 204. In some embodiments, the logic die 206 may be a memory controller. The bottom die 202 may be a similar die (in function and circuitry) to the memory dies 204 except that the bottom die 202 is thicker than the memory dies 204. In some embodiments, the bottom die 202 may be a dummy die. In some alternative embodiments, the bottom die 202 has a thickness T2 in a range from about 406.5 µm to about 413.5 µm.

As shown in FIG. 2, the main body 201 may include the die stack MSD encapsulated in an encapsulant 212. Specifically, the encapsulant 212 may include an underfill material 211 and a molding compound layer 213. The underfill material 211 fills in gaps between the bottom die 202 and the overlying memory die 204, between the memory dies 204, and between the memory die 204 and the overlying logic die 206. In the embodiment, the underfill material 211 laterally encapsulates the connectors 210 and protrudes from the gaps and beyond the sidewalls of the memory dies 204. In another embodiment, the sidewall of the underfill material 211 may be aligned with or concave from the sidewall of the memory dies 204. The molding compound layer 213 laterally encapsulates the underfill material 211 and the bottom die 202. In the case, as shown in FIG. 2, the sidewall of the molding compound layer 213 is aligned with the sidewall of the logic die 206. In some embodiments, the underfill material 211 includes an epoxy-based resin with fillers dispersed therein. The fillers may include insulating fibers, insulating particles, other suitable elements, or a combination thereof. The molding compound layer 213 may include an epoxy-based resin with fillers dispersed therein. The fillers may include insulating fibers, insulating particles, other suitable elements, or a combination thereof. In some alternative embodiments, the size and/or density of the fillers dispersed in the underfill material 211 is smaller than those dispersed in the molding compound layer 213. Accordingly, the underfill material 211 is able to fill in the narrow gaps between the memory dies 204.

Referring back to FIG. 1A, the second die 200 further includes a pad 214, a passivation layer 216, and a connector 220. The pad 214 may be a part of an interconnection structure (not shown) and electrically connected to the devices (not shown) formed in the logic die 206. The passivation layer 216 is formed over the main body 201 and covers a portion of the pad 214. A portion of the pad 214 is exposed by the passivation layer 216 and serves as an external connection of the second die 200. The connector 220 is formed on and electrically connected to the pad 214 exposed by the passivation layer 216. The connector 220 is formed on and electrically connected to the pad 214 not covered by the passivation layer 216. The material and forming method of the pad 214, the passivation layer 216, and the connector 220 are similar to the material and forming method of the pad 104, the passivation layer 106, and the connector 110 illustrated in above embodiments. Thus, details thereof are omitted here. Although only one pad 214 and one connector 220 are illustrated in FIG. 1A, the number of the pad 214 and the connector 220 is not limited in this disclosure. In other embodiments, the number of the pad 214 and the connector 220 may be adjusted depending on actual design needs.

As shown in FIG. 1A, the third die 300 may include a memory die, such as HBM die or HMC die. In some embodiments, the third die 300 may have similar function and/or similar structure with the second die 200 illustrated in above embodiments. Thus, details thereof are omitted here. In some alternative embodiments, the height of the third die 300 is less than the height of the second die 200 due to a thinner bottom die 302 and/or less stacked memory dies 304. The third die 300 also includes a pad 314, a passivation layer 316, and a connector 320. The pad 314 may be a part of an interconnection structure (not shown) and electrically connected to the devices (not shown) formed in a logic die 306. The passivation layer 316 is formed over the main body 301 and covers a portion of the pad 314. A portion of the pad 314 is exposed by the passivation layer 316 and serves as an external connection of the third die 300. The connector 320 is formed on and electrically connected to the pad 314 exposed by the passivation layer 316. The connector 320 is formed on and electrically connected to the pad 314 not covered by the passivation layer 316. The material and forming method of the pad 314, the passivation layer 316, and the connector 320 are similar to the material and forming method of the pad 104, the passivation layer 106, and the connector 110 illustrated in above embodiments. Thus, details thereof are omitted here. Although only one pad 314 and one connector 320 are illustrated in FIG. 1A, the number of the pad 314 and the connector 320 is not limited in this disclosure. In other embodiments, the number of the pad 314 and the connector 320 may be adjusted depending on actual design needs.

In the present embodiment, the first die 100 is different from the second die 200 and the third die 300. For example, the first die 100 may be a system-on-chip (SoC), while the second die 200 and the third die 300 may be a package, such as a memory package. In some embodiments, the memory package may include stacked memory dies, such as dynamic random access memory (DRAM) dies, static random access memory (SRAM) dies, HBM dies, HMC dies, or the like, or a combination thereof. As shown in FIG. 3, the second die 200 and the third die 300 are disposed aside at least one side of the first die 100. In detail, an area and a length of the first die 100 is greater than an area and a length of the second die 200 and/or third die 300. In some alternative embodiments, the number of the second die 200 and/or the third die 300 may be plural, wherein the first die 100 may be surrounded by a plurality of second dies 200 and/or a plurality of third dies 300.

Figure 1B:
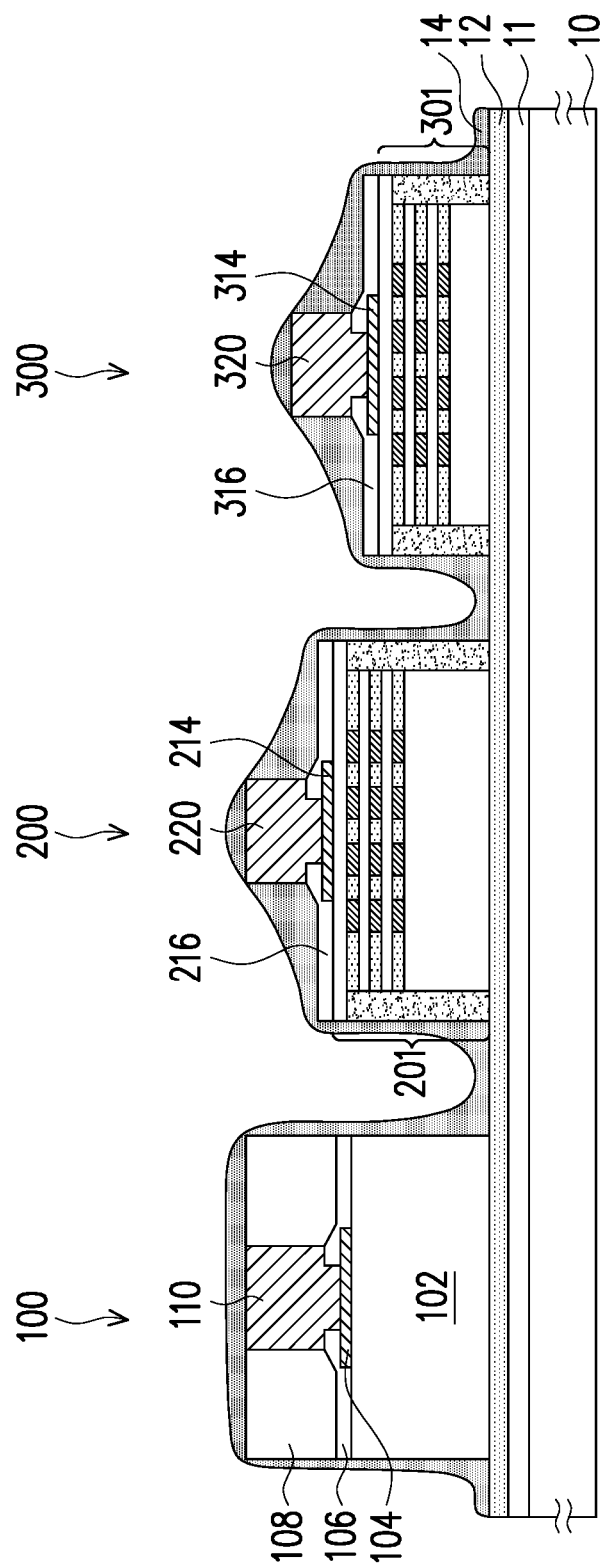

Referring to FIG. 1B, a buffer material 14 is formed to conformally cover the first die 100, the second die 200, and the third die 300. In some embodiments, the buffer material 14 may include an organic dielectric material, such as a polymer, an underfill, or the like. The polymer may include a photosensitive material, a non-photosensitive material, or a combination thereof. In some alternative embodiments, the photosensitive material includes polyimide, epoxy, polybenzoxazole (PBO), benzocyclobutene (BCB), positive photoresist, negative photoresist, a combination thereof, and/or the like. The non-photosensitive material includes Ajinomoto buildup film (ABF). In other embodiments, the underfill may include an epoxy-based resin (or other polymer) with or without fillers dispersed therein. The fillers may include insulating fibers, insulating particles, other suitable elements, or a combination thereof. The buffer material 14 may be formed by dispensing, chemical vapor deposition (CVD), spin coating, or lamination.

Figure 1C:
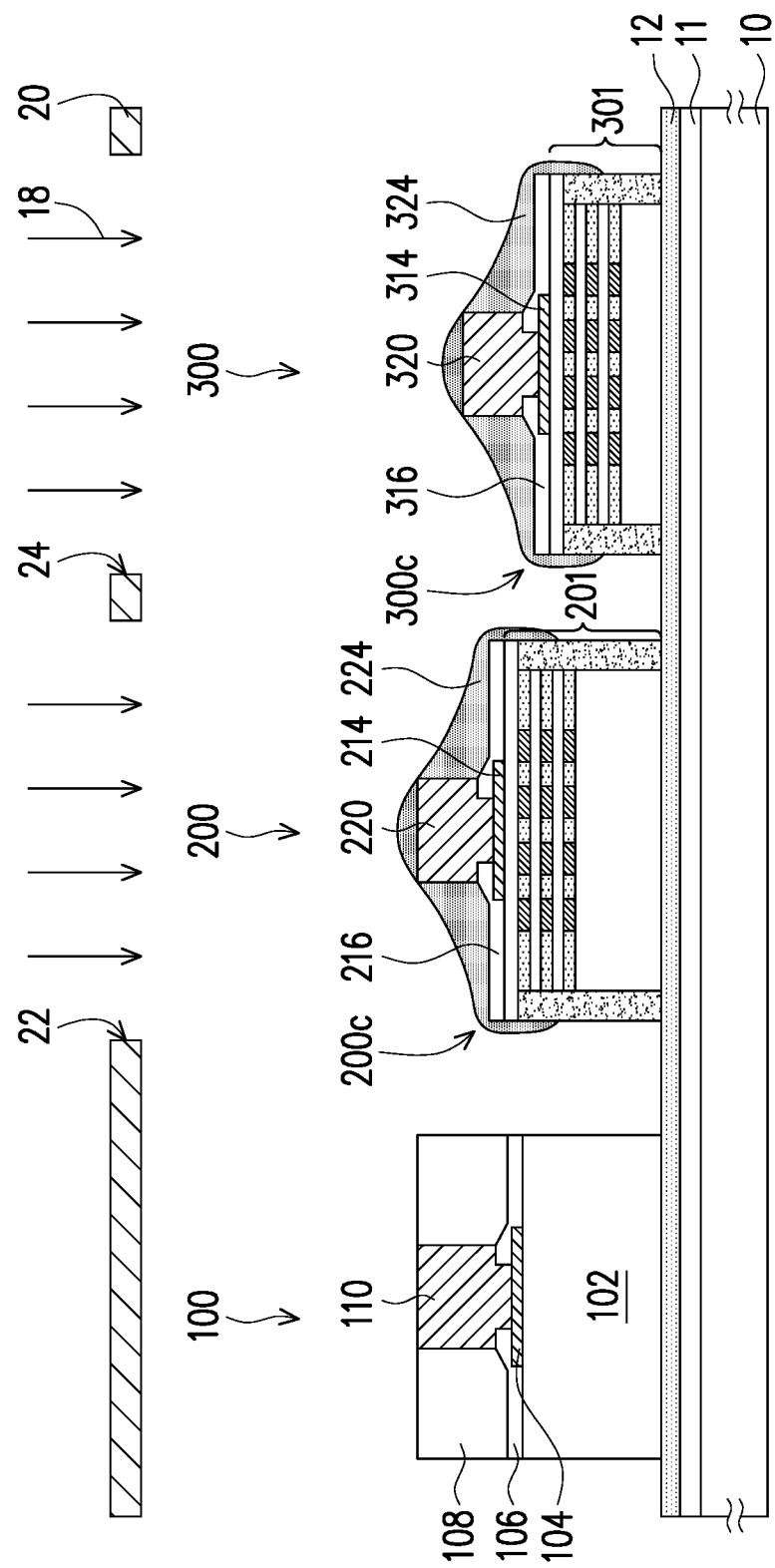

Referring to FIG. 1B and FIG. 1C, the buffer material 14 is irradiated with a laser beam 18 by using a mask 20 with two openings 22 and 24 as photomask when the buffer material 14 includes negative photoresist. After performing a developing process, as shown in FIG. 1C, the buffer material 14 is patterned to form buffer layers 224 and 324 respectively on the second die 200 and the third die 300. In detail, the buffer layer 224 covers the connector 220, the passivation layer 216, and extends to cover upper sidewalls of the main body 201. In the case, the buffer layer 224 forms a cap structure to protect a corner 200c of the second die 200. Similarly, the buffer layer 324 also covers the connector 320, the passivation layer 316, and extends to cover upper sidewalls of the main body 301. In the case, the buffer layer 324 forms another cap structure to protect a corner 300c of the third die 300.

In some embodiments, as shown in the top view of FIG. 3, the openings 22 and 24 are rectangle and respectively correspond to the positions of the second die 200 and the third die 300. In the case, the second die 200 has a perimeter 200p smaller than a range of the opening 22, and the third die 300 has a perimeter 300p smaller than a range of the opening 24. That is, an area of the opening 22 or 24 is greater than an area of the second die 200 or the third die 300. Accordingly, the formed buffer layer 224 or 324 not only covers top surface of the second die 200 or the third die 300, but also covers the upper sidewalls of the main body 201 or 301. In some alternative embodiments, when the buffer material 14 includes positive photoresist, the pattern of the mask 20 may be reversed. That is, the mask may cover the positions of the second die 200 and the third die 300, while expose the positions of the first die 100.

Figure 1D:
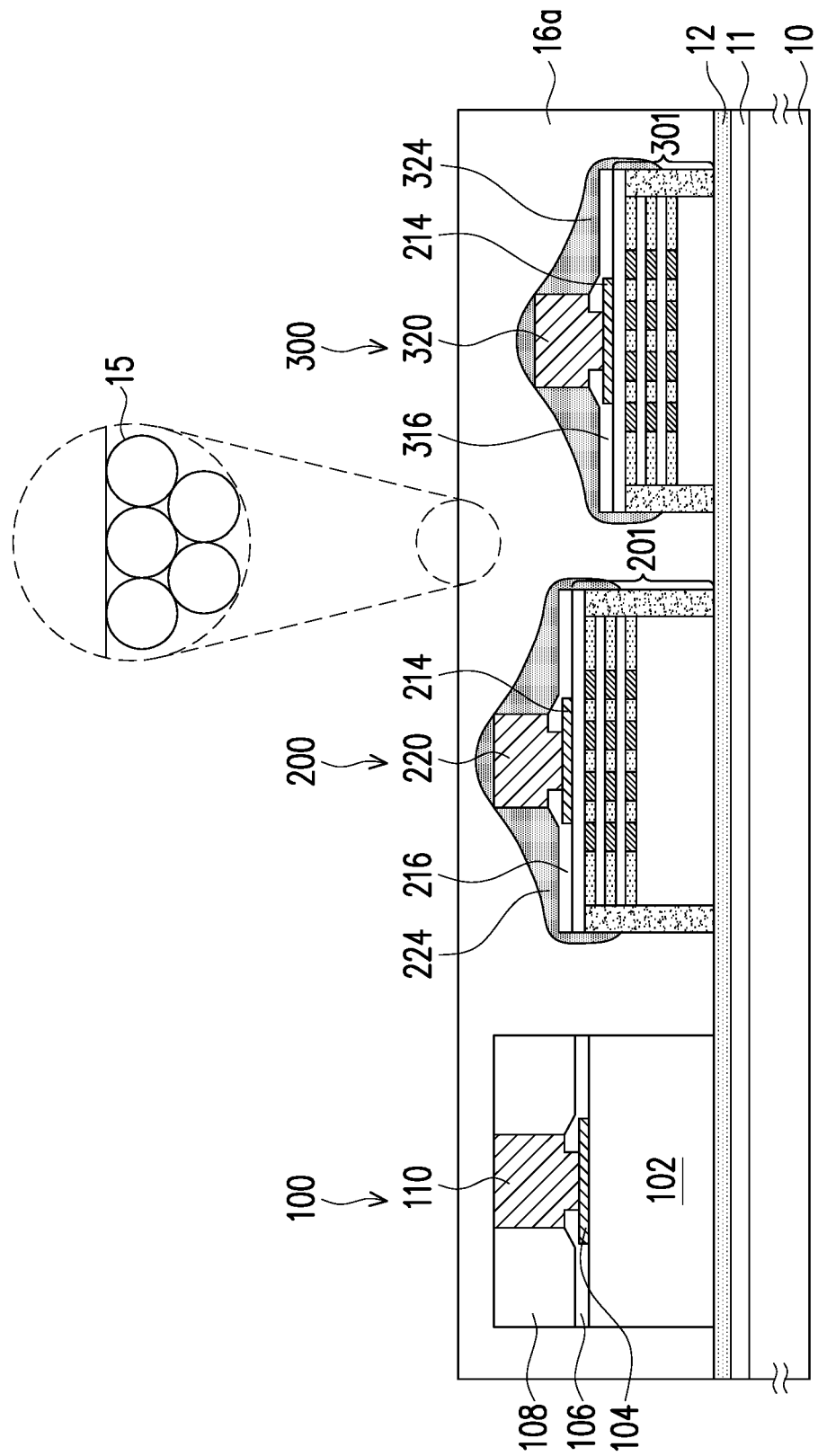

Referring to FIG. 1D, an encapsulant material layer 16a is formed on the carrier 10, the first die 100, the second die 200, and the third die 300 by a suitable fabrication technique such as spin-coating, lamination, deposition, molding process or similar processes. The encapsulant material layer 16a encapsulates the first die 100, the second die 200, and the third die 300 and covers the buffer layers 224 and 324 respectively on the second die 200 and the third die 300. In some embodiments, the encapsulant material layer 16a includes a molding compound, a molding underfill, a resin such as epoxy, a combination thereof, or the like. In alternative embodiments, the encapsulant material layer 16a includes nitride such as silicon nitride, oxide such as silicon oxide, phosphosilicate glass (PSG), borosilicate glass (BSG), boron-doped phosphosilicate glass (BPSG), a combination thereof, or the like.

In yet another embodiment, the encapsulant material layer 16a includes a composite material including a base material and a plurality of fillers 15. In some embodiments, the base material may be a polymer, a resin, an epoxy, or the like; and the fillers 15 may be dielectric particles of $SiO_2$, $Al_2O_3$, boron nitride, silica, or the like, and may have spherical shapes. That is, the cross-section shape of the filler 15 may be circle, oval, or any other shape. The particle size of the filler 15 ranges from 1 μm to 35 μm, for example. In some embodiments, the particle size is referred to the average particle size D50. In some embodiments, the filler 15 is a hollow filler, but the disclosure is not limited thereto. In some other embodiments, the filler 15 may be a solid filler.

Figure 1E:
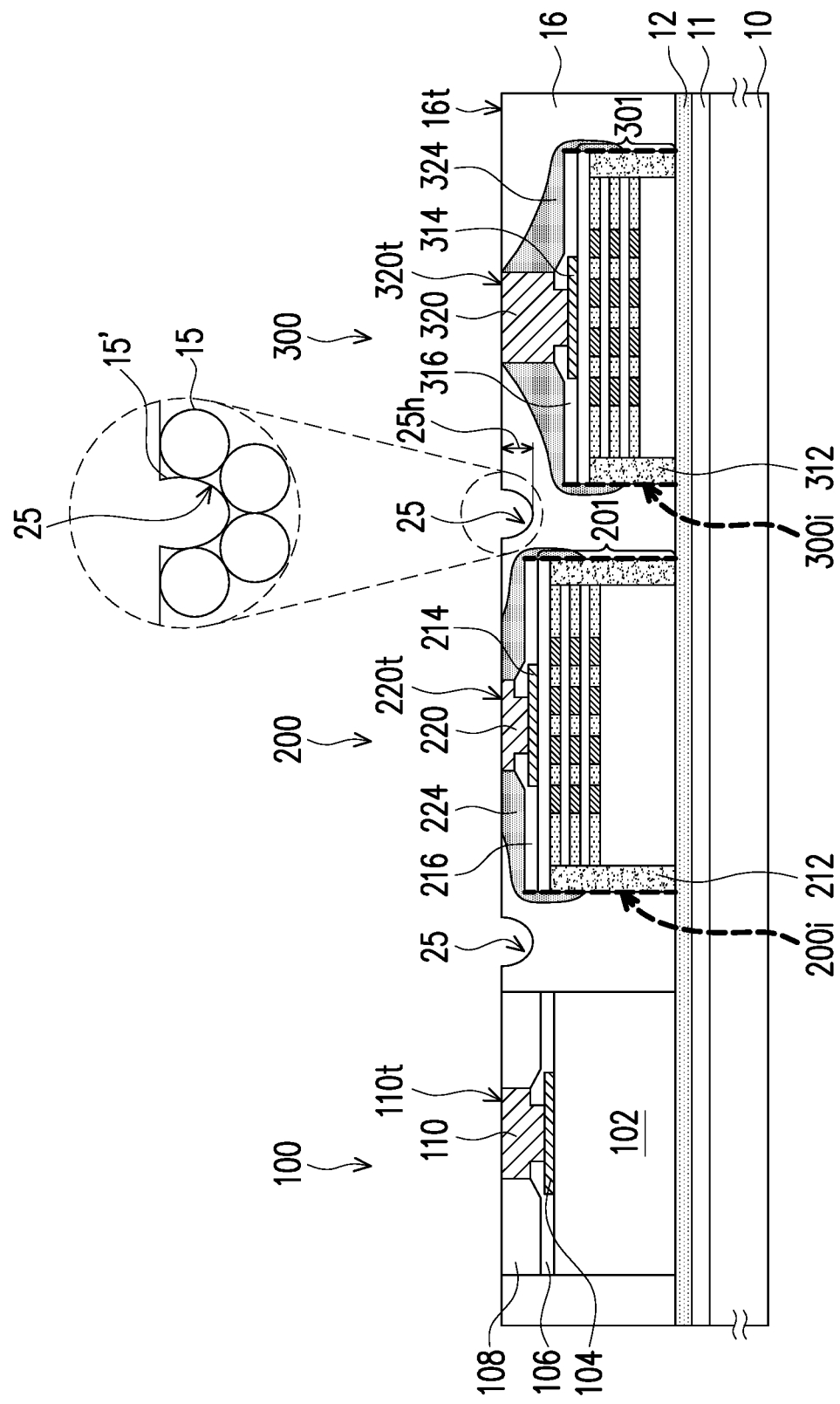

Referring to FIG. 1D and FIG. 1E, a first planarization process is performed to remove the encapsulant material layer 16a over the first die 100, the second die 200, and the third die 300 until the lowest connector 320 is revealed, and an encapsulant 16 is formed. The first planarization process includes a polishing or grinding process, such as a CMP process. In some embodiments, a top surface 16t of the encapsulant 16 is substantially coplanar with a top surface 110t of the connector 110, a top surface 220t of the connector 220, and a top surface 320t of the connector 320.

It should be noted that the buffer layers 224 and 324 can protect the second and third dies 200 and 300, especially the corners 200c and 300c, from damage during the first planarization process. Specifically, the buffer layer 224 and 324 have a Young's modulus less than a Young's modulus of the encapsulant 16 and a Young's modulus of the encapsulants 212 and 312, as shown in FIG. 1E. That is, the buffer layers 224 and 324 is softer or more elastic than the encapsulants 16, 212, and 312. Accordingly, the buffer layer 224 (or 324) disposed between the encapsulants 16 and 212 (or the encapsulants 16 and 312) is able to release or reduce a thermal stress resulted from the coefficient of thermal expansion (CTE) mismatch. In the case, the buffer layers 224 is able to improve an adhesion between an interface 200i between the encapsulants 16 and 212 and between an interface 300i between the encapsulants 16 and 312, so as to avoid the crack or delamination issue thereby enhancing the yield and the reliability. In some embodiments, the buffer layers 224 and 324 have a CTE greater than a CTE of the encapsulant 16 and a CTE of the encapsulants 212 and 312. In another embodiment, the buffer layers 224 and 324 may include a polymer with fillers dispersed therein. In the case, a filler content and/or a filler size of the buffer layers 224 and 324 may be less than a filler content and/or a filler size of the encapsulant 16 and a filler content and/or a filler size of the encapsulants 212 and 312. Herein, the filler size is referred to the average particle size D50. In alternative embodiments, the buffer layers 224 and 324 have an elongation greater than an elongation of the encapsulant 16 and an elongation of the encapsulants 212 and 312.

Referring to FIG. 1E, in some embodiments, one or more pits (or referred as recesses) 25 may be formed in the encapsulant 16 after the first planarization process. In some embodiments, a height 25h of the pit 25 ranges from 1 μm to 35 μm.

Still referring to FIG. 1D and FIG. 1E, in some embodiments in which the encapsulant material layer 16a includes fillers 15, some of fillers 15 are completely removed, some of the fillers 15 are partially removed during the first planarization process. In the embodiments in which the filler 15 is a hollow filler and partially removed, the top of the hollow filler 15 may be removed. In other word, the top of the filler 15' is open and a filler 15' having a pit 25 is formed. The height 25h of the pit 25 is related to the particle size of the filler 15. However, the disclosure is not limited thereto, in other embodiments, no pit is included in the encapsulant 16 after the first planarization process. That is, the top surface 16t of the encapsulant 16 may be referred to as a planar surface.

Figure 1F:
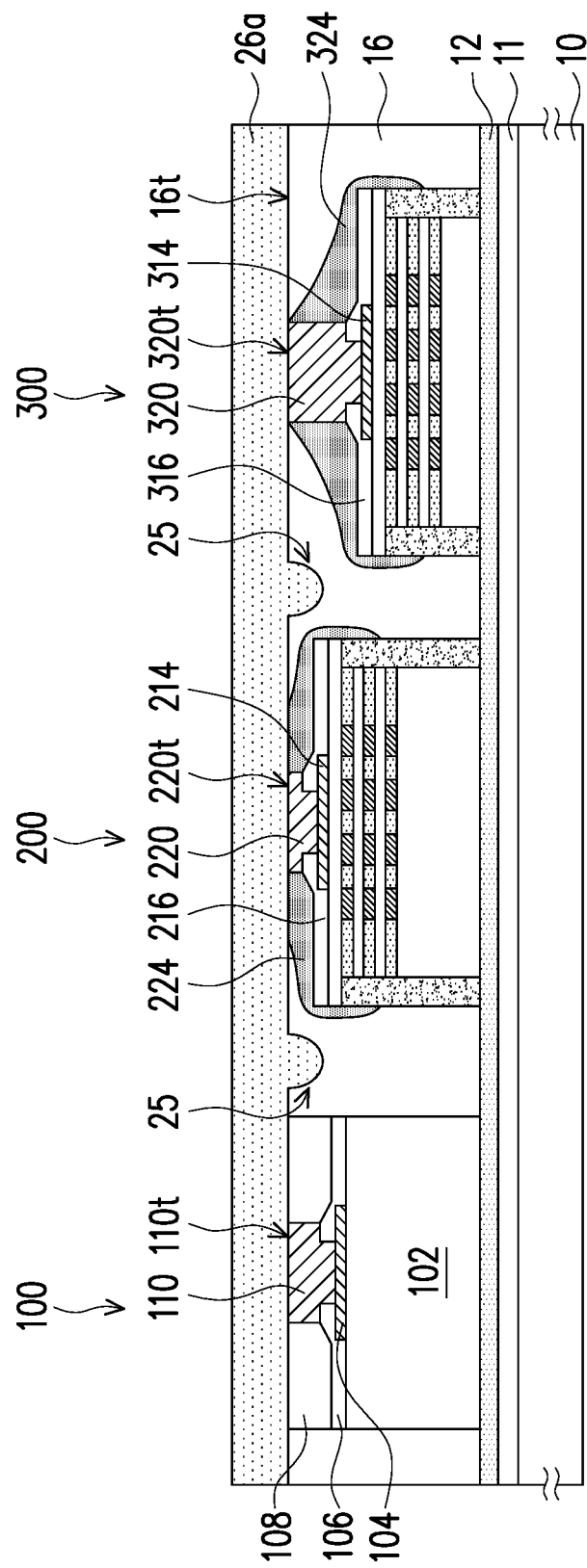

Referring to FIG. 1F, an insulating layer 26a is formed to fill in the pits 25 and cover the top surface 16t of the encapsulant 16, the top surface 110t of the connector 110, the top surface 220t of the connector 220, and the top surface 320t of the connector 320. In some embodiments, the insulating layer 26 may include polymer, such as polyimide, epoxy resin, acrylic resin, phenol resin, benzocyclobutene (BCB), polybenzooxazole (PBO), or any other suitable polymer-based materials. In some alternative embodiments, the material of the insulating layer 26 may be the same as or different from the material of the encapsulant 16.

Figure 1G:
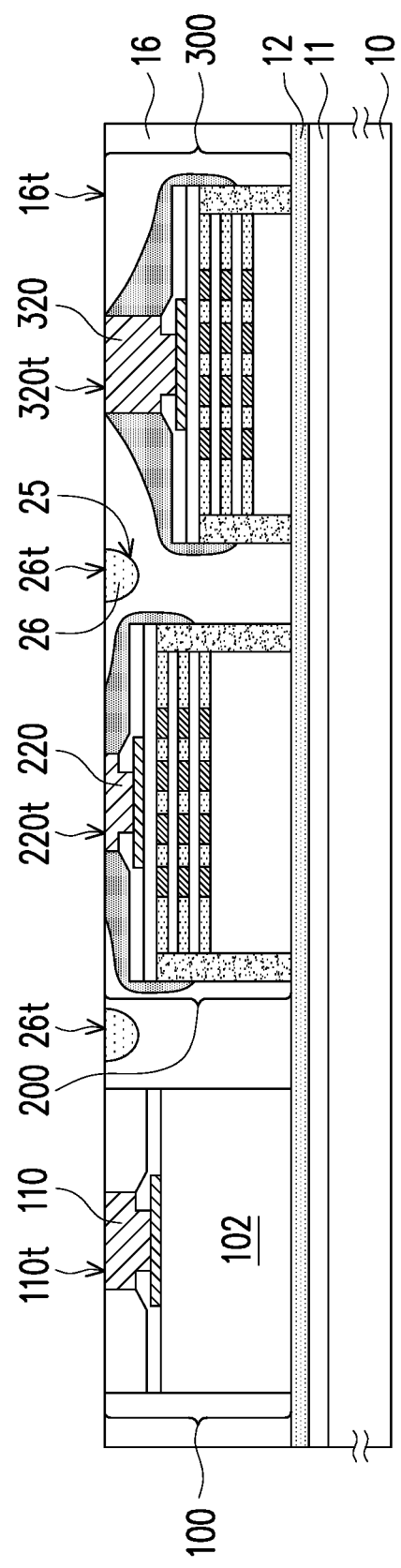

Referring to FIG. 1F and FIG. 1G, a second planarization process is performed to remove the insulating layer 26a over the encapsulant 16 until the connectors 110, 220, and 320 are revealed, and a plurality of filling structures 26 are formed in the encapsulant 16. The second planarization process includes a polishing or grinding process, such as a CMP process. In the case, as shown in FIG. 1G, top surfaces 26t of the filling structures 26 are coplanar with the top surface 16t of the encapsulant 16, the top surface 110t of the connector 110, the top surface 220t of the connector 220, and the top surface 320t of the connector 320. In other embodiments, no filling structure 26 is included in the encapsulant 16 if no pit 25 is formed after the foregoing first planarization process, as shown in FIG. 4B.

Figure 1H:
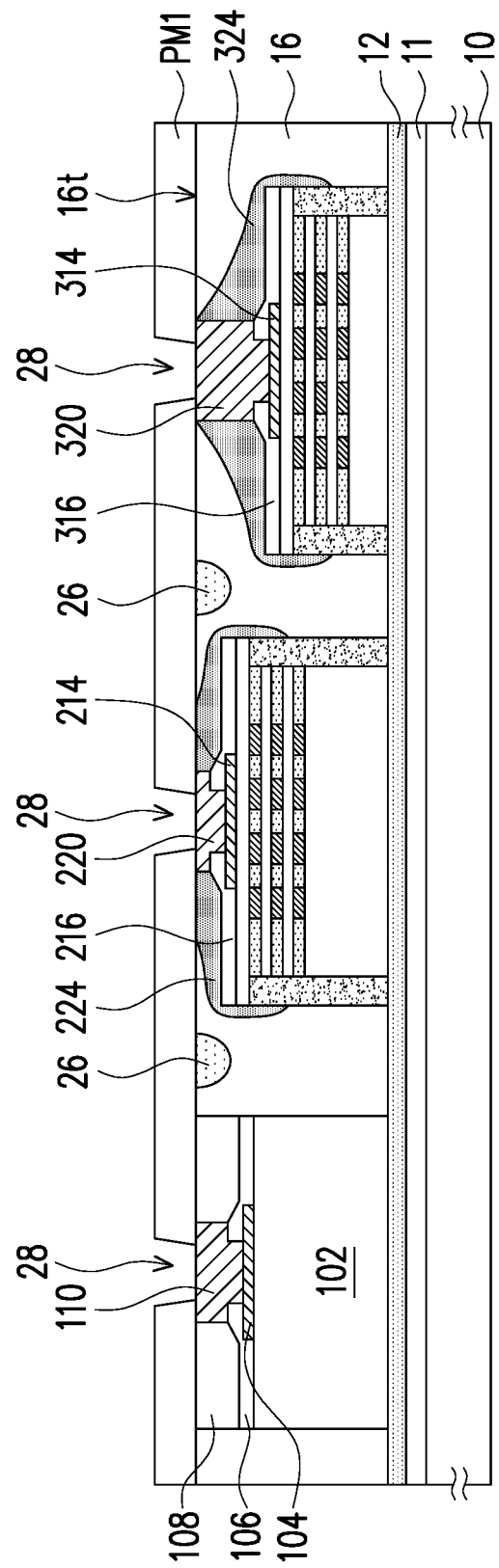

Referring to FIG. 1G and FIG. 1H, a polymer layer PM1 is formed on the encapsulant 16. The polymer layer PM1 has a plurality of openings 28. In some embodiment, the openings 28 are via holes, respectively exposing the top surface 110t of the connector 110, the top surface 220t of the connector 220, and the top surface 320t of the connector 320. In some embodiments, the cross-section shape of the opening 28 is square, rectangle, trapezoid, inverted trapezoid, or the like. The base angle of the opening 28 is an acute angle, a right angle, or an obtuse angle, for example. In some embodiments, the polymer layer PM1 includes a photo-sensitive material such as polybenzoxazole (PBO), polyimide (PI), benzocyclobutene (BCB), a combination thereof or the like. In some alternative embodiments, the material of the polymer layer PM1 may be the same as or different from the material of the encapsulant 16.

Figure 1I:
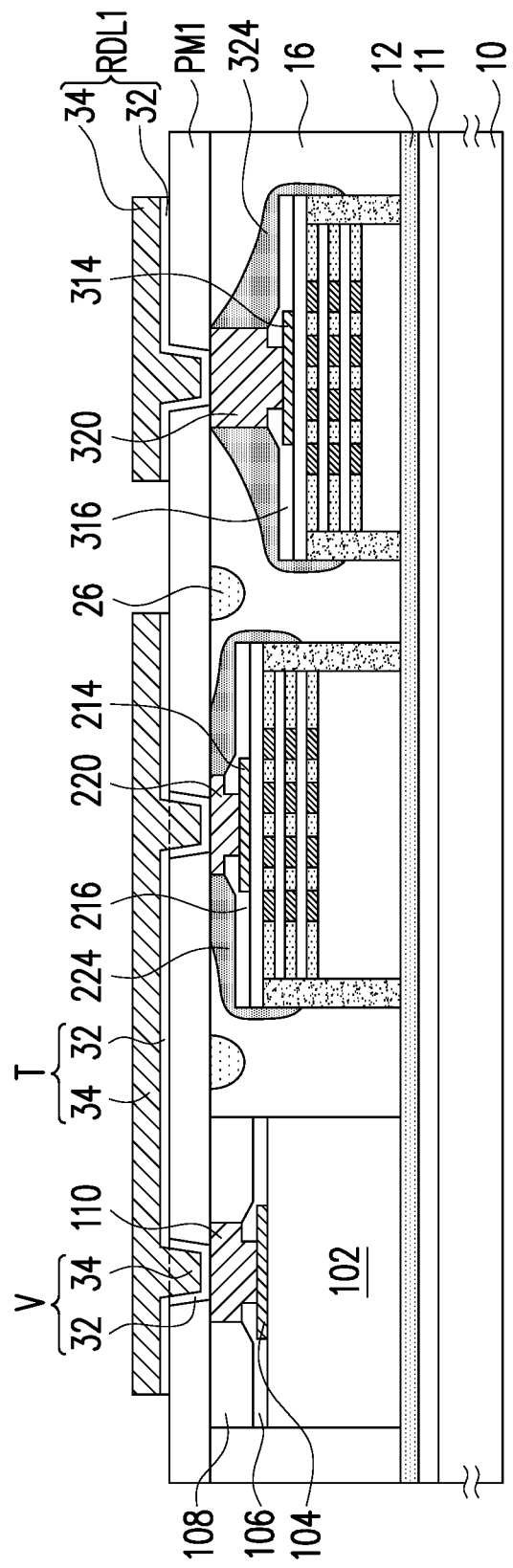

Referring to FIG. 1H and FIG. 1I, a redistribution layer RDL1 is formed on the polymer layer PM1 to be in electrical contact with the connectors 110, 220, and 320 respectively. The redistribution layer RDL1 is formed by forming a seed material blanketly on the polymer layer PM1, forming one or more patterned masks with a plurality of openings corresponding to the connectors 110, 220, and 320, filling a conductive material in the openings, removing the patterned masks, and removing a portion of the seed material uncovered by the conductive material. In the case, as shown in FIG. 1I, a conductive layer 34 and an underlying seed layer 32 constitute the redistribution layer RDL1. In some embodiments, the seed layer 32 may be a conformal seed layer to conformally cover the openings 28, and a portion of the polymer layer PM1. In some alternative embodiments, the seed layer 32 is a metal layer, which may be a single layer or a composite layer including a plurality of sub-layers formed of different materials, and is formed by a CVD process or a PVD process, such as sputtering. For example, the seed layer 32 is a titanium/copper composited layer. In some embodiments, the conductive layer 34 includes metal, such as copper, nickel, titanium, a combination thereof or the like, and is formed by an electroplating process, a CVD process or a PVD process, such as sputtering.

Referring to FIG. 1I, the redistribution layer RDL1 includes a plurality of vias V and a plurality of traces T connected to each other, in some embodiments. The via V is formed of the seed layer 32 and the conductive layer 34 in the opening 28 of the polymer layer PM1, the top (or topmost) surface of the via V is substantially coplanar with the top surface of the polymer layer PM1. The trace T is formed of the seed layer 32 and the conductive layer 34 on the top surface of the polymer layer PM1. The via V penetrates trough the polymer layer PM1 to be in electrical contact with the connectors 110, 220, and/or 330 respectively. The trace T is extending on the top surface of the polymer layer PM1, and is electrically connected to the connector 110, 220, and/or 330 through the via V.

Figure 1J:
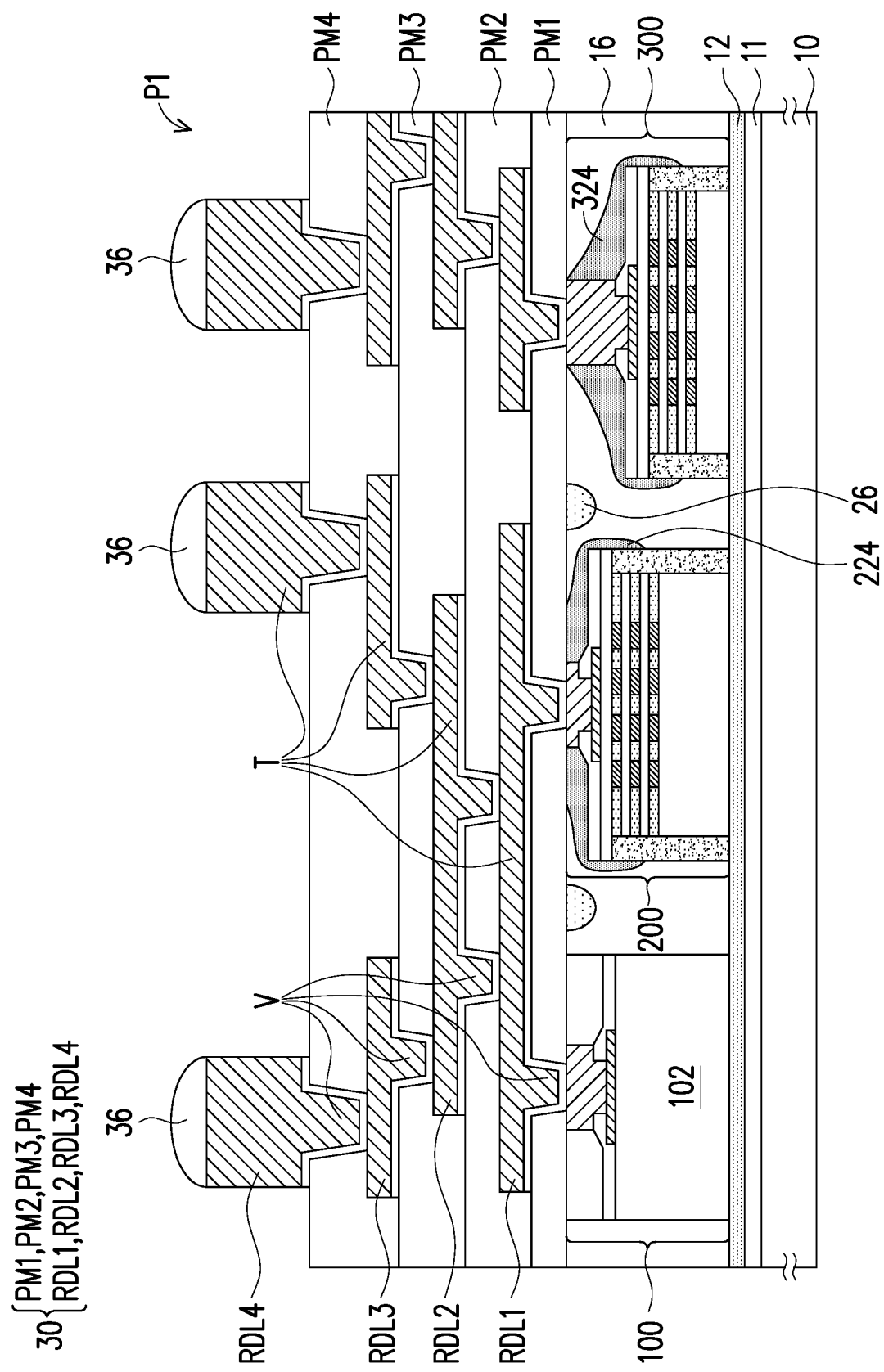

Referring to FIG. 1I and FIG. 1J, polymer layers PM2, PM3, PM4 and redistribution layers RDL2, RDL3, RDL4 are formed on the polymer layer PM1 and the redistribution layer RDL1. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. The materials and the forming methods of the polymer layers PM2, PM3, PM4 may be similar to or different from those of the polymer layer PM1. The structure, materials and the forming methods of the redistribution layers RDL2, RDL3, RDL4 may be similar to or different from those of the redistribution layer RDL1. Similarly, the redistribution layers RDL2, RDL3, RDL4 respectively include vias V and traces T. The vias V penetrates through the polymer layers PM1, PM2, PM3 and PM4 to connect the traces T of the redistribution layers RDL1, RDL2, RDL3 and RDL4, and the traces T are respectively located on the polymer layers PM1, PM2, PM3 and PM4, and are respectively extending on the top surface of the polymer layers PM1, PM2, PM3 and PM4.

The polymer layers PM1, PM2, PM3, PM4 and the redistribution layers RDL1, RDL2, RDL3, RDL4 are stacked alternately, and form a redistribution layer (RDL) structure 30. In some embodiments, the RDL structure 30 is located on a front side (which is referred to as an active surface close to the connectors 110, 220, and 320) of the dies 100, 200, and 300. In some embodiments, the first die 100, the second die 200, and the third die 300 are electrically connected to each other through the RDL structure 30. In some alternative embodiments, the filling structures 26 are embedded in the encapsulant 16 and sandwiched between the encapsulant 16 and the RDL structure 30.

In some embodiments, the redistribution layer RDL4 is the topmost redistribution layer of the RDL structure 30, and is also referred to as an under-ball metallurgy (UBM) layer for ball mounting.

Thereafter, a plurality of connectors 36 are formed over and electrically connected to the redistribution layer RDL4 of the RDL structure 30. In some embodiments, the connectors 36 are referred to as conductive terminals. In some embodiments, the connectors 36 may be ball grid array (BGA) connectors, solder balls, controlled collapse chip connection (C4) bumps, or a combination thereof. In some embodiments, the material of the connector 36 includes copper, aluminum, lead-free alloys (e.g., gold, tin, silver, aluminum, or copper alloys) or lead alloys (e.g., lead-tin alloys). The connector 36 may be formed by a suitable process such as evaporation, plating, ball dropping, screen printing and reflow process, a ball mounting process or a C4 process. In some embodiments, metal posts or metal pillars may further be formed between the redistribution layer RDL4 and the connectors 36. The connectors 36 are electrically connected to the first die 100, the second die 200, and the third die 300 through the RDL structure 30 respectively.

After forming the connectors 36, the carrier 10 may be released with the de-bonding layer 11 decomposed under the heat of light, so as to accomplish a package structure P1. In some embodiments, the adhesive layer 12 may be optionally removed or remained. Thereafter, the package structure P1 may be bonded to a circuit substrate by the connectors 36, so as to form an integrated fan-out-on-Substrate (InFO-on-Substrate) structure, in one embodiment.

Figure 4A:
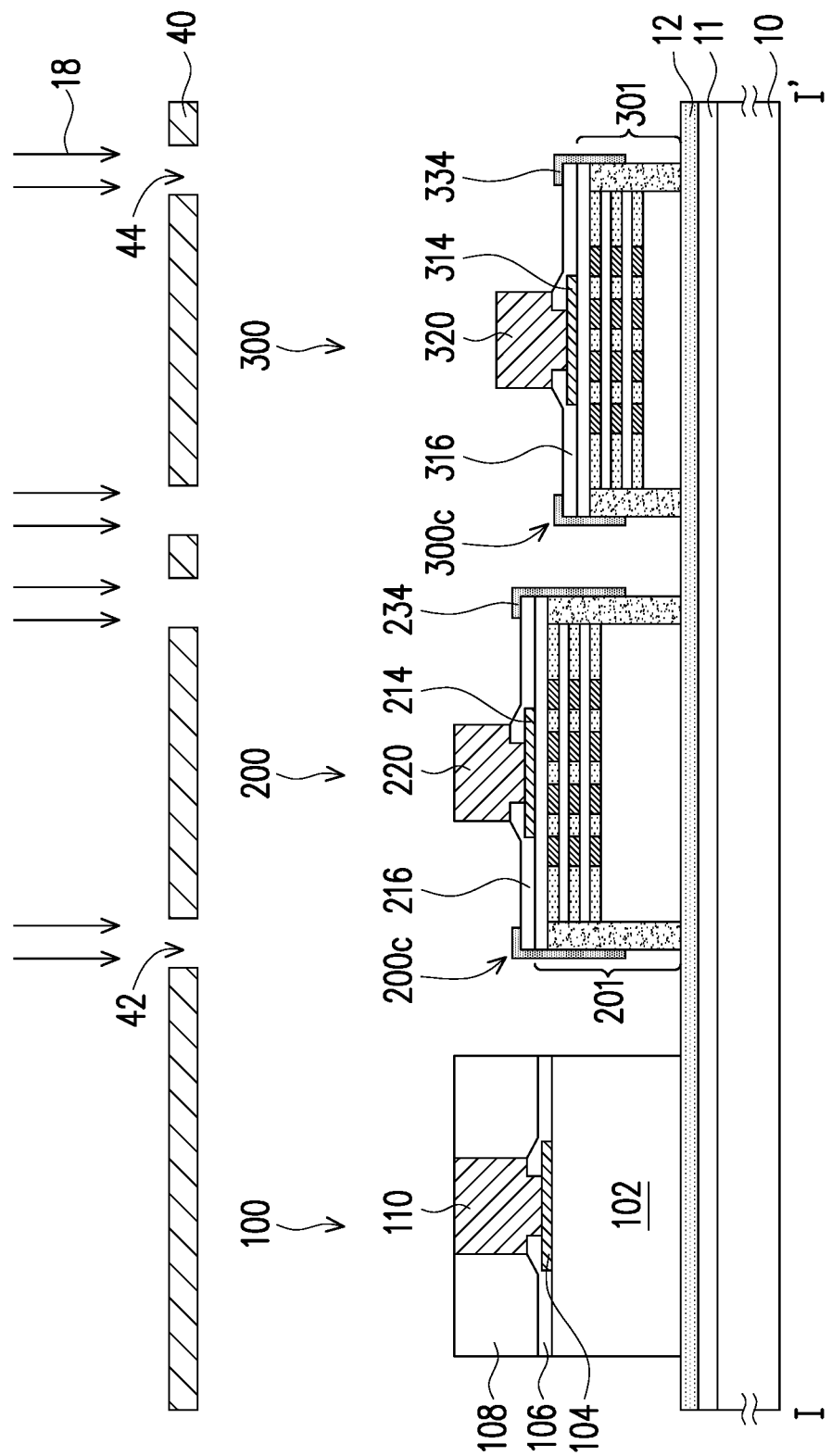
FIG. 4A to FIG. 4B are schematic cross-sectional views illustrating a method of forming a package structure according to a second embodiment of the disclosure.
Figure 4B:
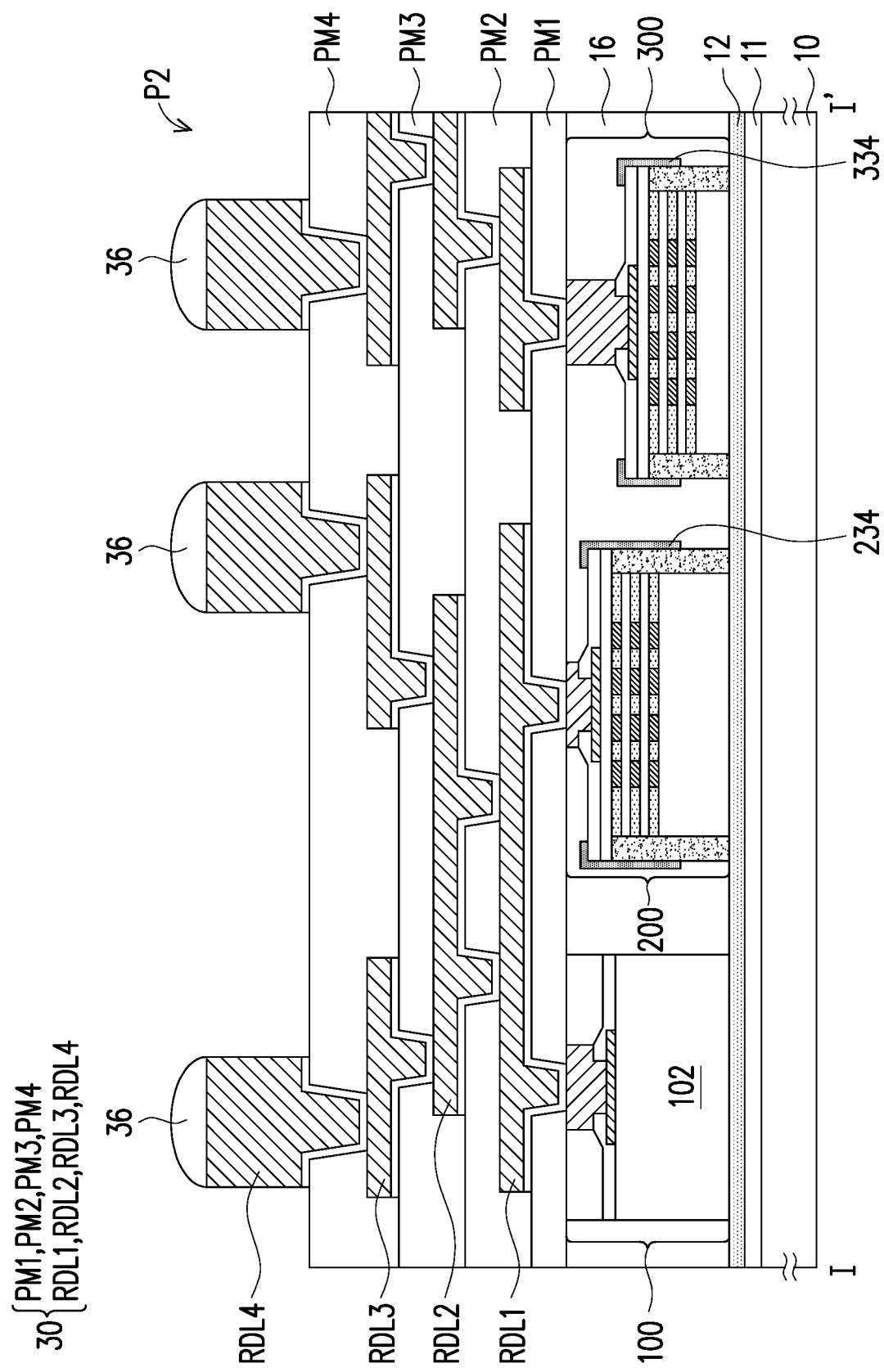
Figure 5:
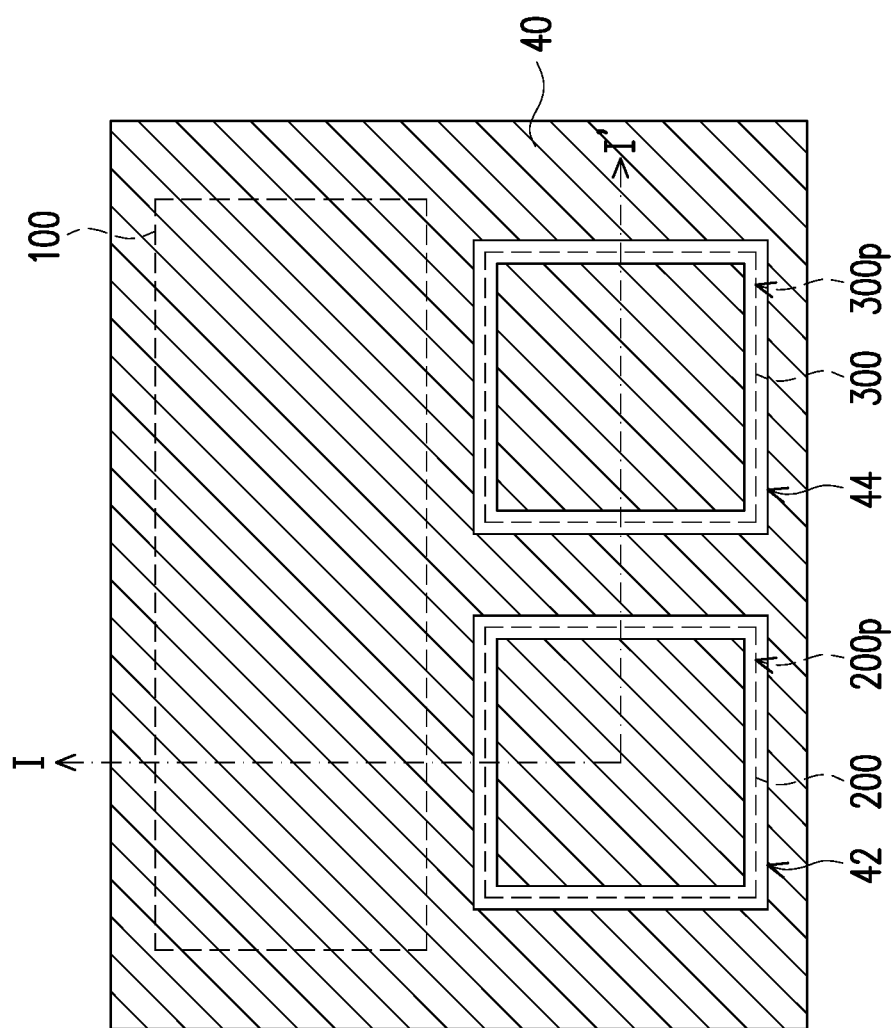
FIG. 5 is a schematic top view illustrating a mask of forming a buffer layer of FIG. 4A.

FIG. 4A to FIG. 4B are schematic cross-sectional views illustrating a method of forming a package structure according to a second embodiment of the disclosure. FIG. 5 is a schematic top view illustrating a mask of forming a buffer layer of FIG. 4A.

FIG. 4A illustrates irradiating the buffer material 14 (as shown in FIG. 1B) with the laser beam 18 by using a mask 40 with two openings 42 and 44 as photomask when the buffer material 14 includes negative photoresist. The structures, materials, and processes may be similar to what are shown in, and discussed referring to, FIG. 1B. The details are thus no repeated herein. After performing a developing process, as shown in FIG. 4A, the buffer material 14 is patterned to form buffer layers 234 and 334 respectively on the second die 200 and the third die 300. In detail, the buffer layer 234 covers a portion of a top surface of the passivation layer 216 and extends to cover upper sidewalls of the main body 201. From the perspective of the top view, the buffer layer 234 forms a ring structure to protect a corner 200c of the second die 200. Similarly, the buffer layer 334 also covers a portion of a top surface of the passivation layer 316 and extends to cover upper sidewalls of the main body 301. From the perspective of the top view, the buffer layer 334 forms another ring structure to protect a corner 300c of the third die 300.

In some embodiments, as shown in the top view of FIG. 5, the openings 42 and 44 are rectangular ring and respectively correspond to a perimeter 200p of the second die 200 and a perimeter 300p of the third die 300. In the case, the perimeter 200p of the second die 200 is within the range of the opening 42 and the perimeter 300p of the third die 300 is also within the range of the opening 44. That is, the perimeters 200p and 300p are exposed by the openings 42 and 44 in the top view of FIG. 5. Accordingly, after the developing process, the formed buffer layer 234 or 334 at least covers the upper sidewalls of the main body 201 or 301, and further covers a portion of the top surface of the second die 200 or the third die 300. In some alternative embodiments, when the buffer material 14 includes positive photoresist, the pattern of the mask 40 may be reversed. That is, the mask may cover the perimeters 200p and 300p of the second die 200 and the third die 300, while expose the position of the first die 100.

Referring to FIGS. 4A and 4B, after forming the buffer layers 234 and 334, the steps illustrated in FIG. 1D to FIG. 1J are performed, so as to form the encapsulant 16 laterally encapsulating the first die 100, the second die 200, and the third die 300, form the RDL structure 30 on the encapsulant 16, and form the connectors 36 on the redistribution layer RDL4 of the RDL structure 30. The structures, materials, and processes may be similar to what are shown in, and discussed referring to, FIG. 1D to FIG. 1J. The details are thus no repeated herein.

After forming the connectors 36, the carrier 10 may be released with the de-bonding layer 11 decomposed under the heat of light, so as to accomplish a package structure P2. In some embodiments, the adhesive layer 12 may be optionally removed or remained. Thereafter, the package structure P2 may be bonded to a circuit substrate by the connectors 36, so as to form an InFO-on-Substrate structure, in one embodiment.

Figure 6A:
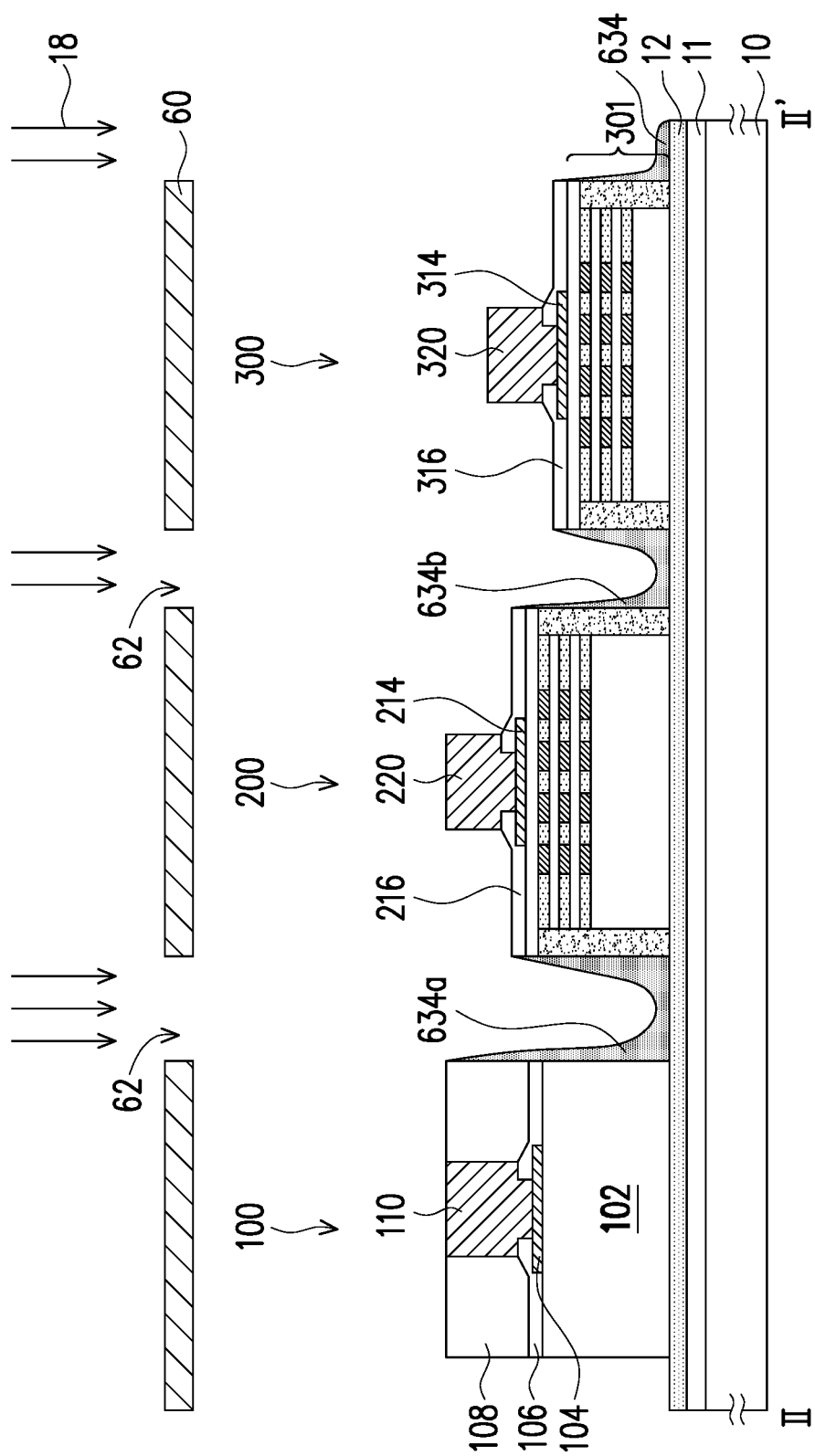
FIG. 6A to FIG. 6B are schematic cross-sectional views illustrating a method of forming a package structure according to a third embodiment of the disclosure.
Figure 6B:
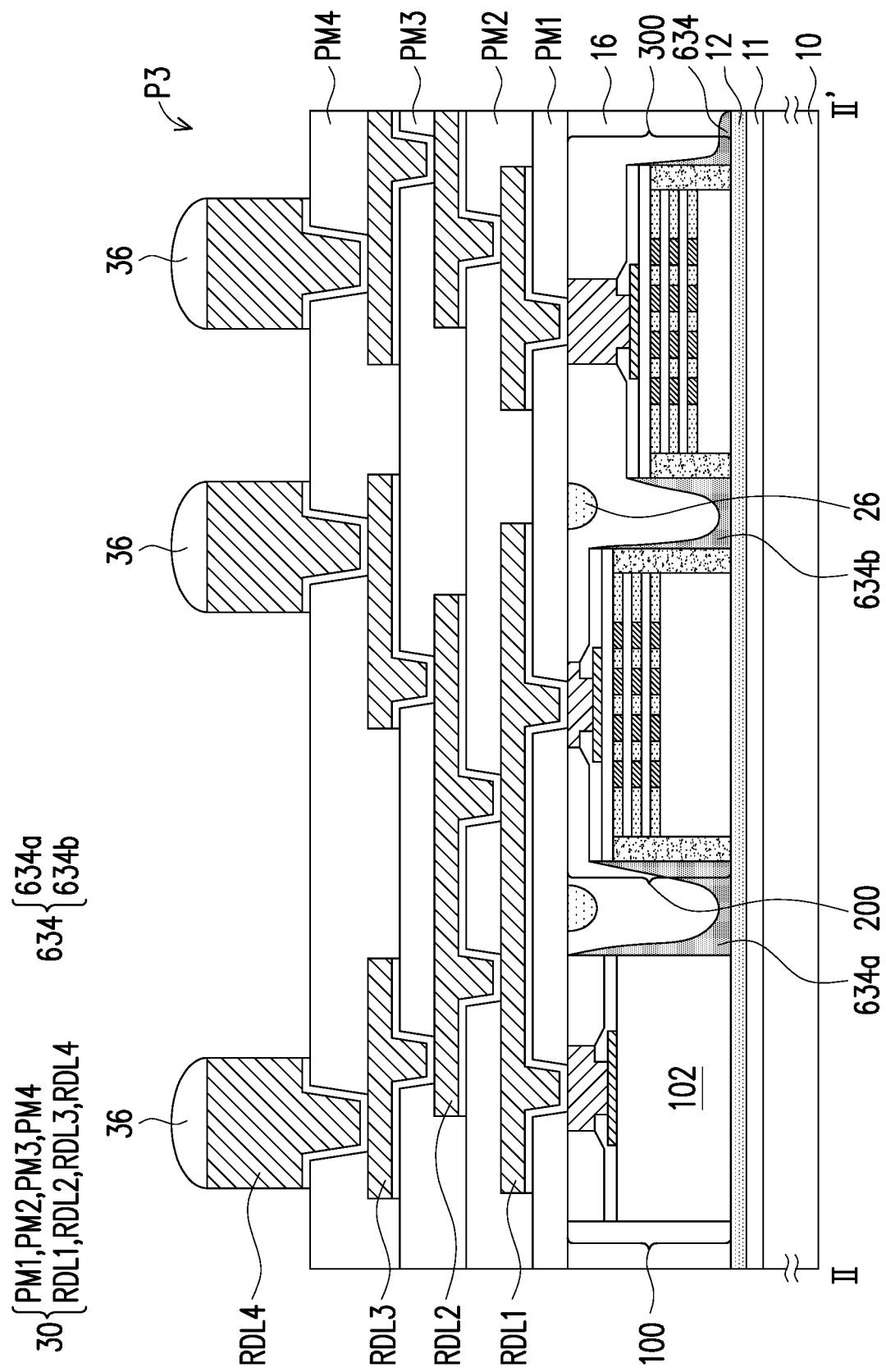
Figure 7:
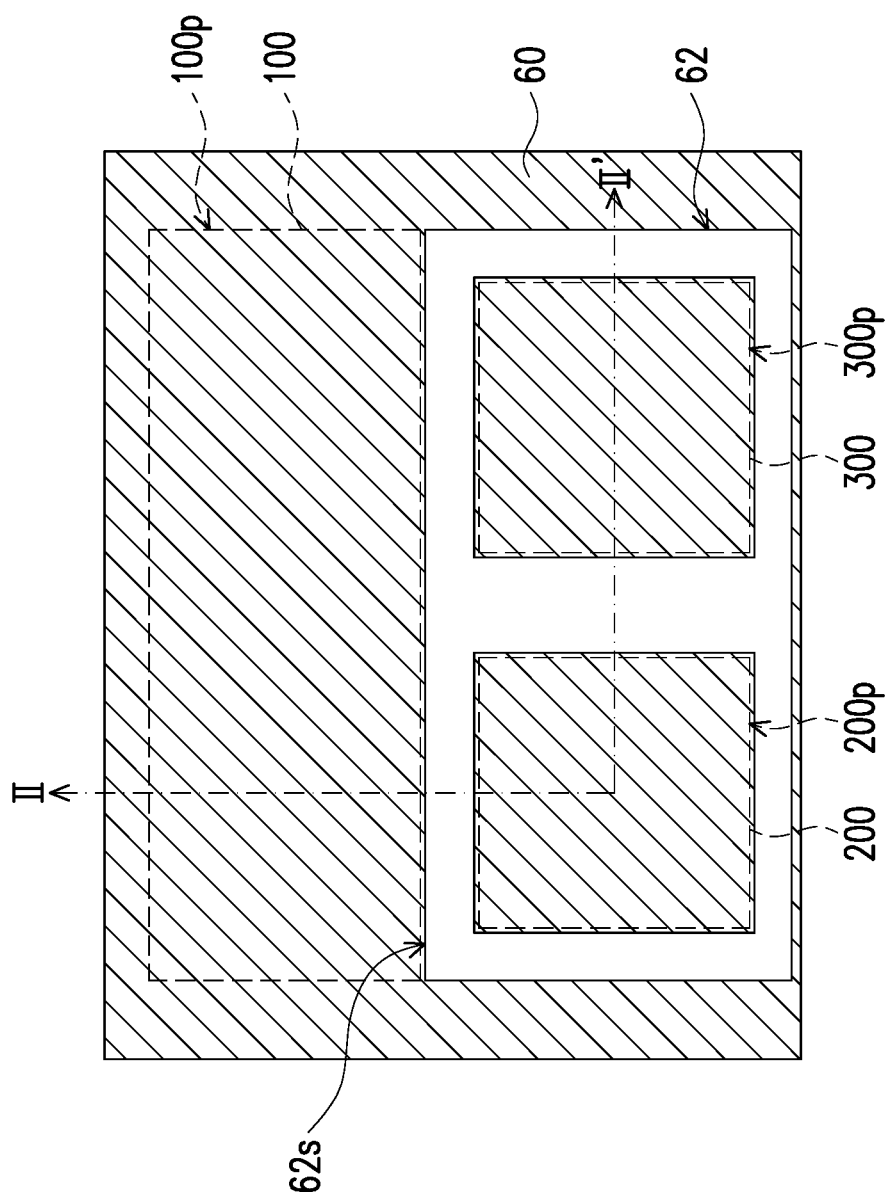
FIG. 7 is a schematic top view illustrating a mask of forming a buffer layer of FIG. 6A.

FIG. 6A to FIG. 6B are schematic cross-sectional views illustrating a method of forming a package structure according to a third embodiment of the disclosure. FIG. 7 is a schematic top view illustrating a mask of forming a buffer layer of FIG. 6A.

FIG. 6A illustrates irradiating the buffer material 14 (as shown in FIG. 1B) with the laser beam 18 by using a mask 60 with an opening 62 as photomask when the buffer material 14 includes negative photoresist. The structures, materials, and processes may be similar to what are shown in, and discussed referring to, FIG. 1B. The details are thus no repeated herein. After performing a developing process, as shown in FIG. 6A, the buffer material 14 is patterned to form a buffer layer 634 respectively on sidewalls of the first die 100, sidewalls of the second die 200, and sidewall of the third die 300. In detail, the buffer layer 634a extends continuously from the sidewall of the first die 100 to cover a portion of the top surface of the adhesive layer 12 and the sidewall of the second die 200 adjacent to the first die 100. That is, the buffer layer 634a is a continuous structure to connect the facing sidewalls of the first die 100 and the second die 200. Similarly, the buffer layer 634b also extends continuously from the sidewall of the second die 200 to cover a portion of the top surface of the adhesive layer 12 and the sidewall of the third die 300 adjacent to the second die 200. That is, the buffer layer 634b is a continuous structure to connect the facing sidewalls of the second die 200 and the third die 300. From the perspective of the top view, the buffer layer 634 forms a mesh structure to protect the sidewalls of the second die 200 and the third die 300.

In some embodiments, as shown in the top view of FIG. 7, the opening 62 is rectangle frame shape to surround the perimeter 200p of the second die 200 and the perimeter 300p of the third die 300. That is, the perimeters 200p and 300p are exposed by the opening 62 in the top view of FIG. 7. Accordingly, after the developing process, the formed buffer layer 634 at least covers the sidewalls of the second die 200 and the second die 300, and further surrounds the second die 200 and the second die 300. In another embodiment, an upper side 62s of the opening 62 may be retracted downward, so that the upper side 62s of the opening 62 is not in contact or overlapped with the perimeter 100p of the first die 100. In the case, the buffer layer 634 does not cover the sidewalls of the first die 100. In some alternative embodiments, when the buffer material 14 includes positive photoresist, the pattern of the mask 60 may be reversed.

Referring to FIGS. 6A and 6B, after forming the buffer layer 634, the steps illustrated in FIG. 1D to FIG. 1J are performed, so as to form the encapsulant 16 laterally encapsulating the first die 100, the second die 200, and the third die 300, optionally form the insulating layers 26 in the encapsulant 16, form the RDL structure 30 on the encapsulant 16, and form the connectors 36 on the redistribution layer RDL4 of the RDL structure 30. The structures, materials, and processes may be similar to what are shown in, and discussed referring to, FIG. 1D to FIG. 1J. The details are thus no repeated herein.

After forming the connectors 36, the carrier 10 may be released with the de-bonding layer 11 decomposed under the heat of light, so as to accomplish a package structure P3. In some embodiments, the adhesive layer 12 may be optionally removed or remained. Thereafter, the package structure P3 may be bonded to a circuit substrate by the connectors 36, so as to form an InFO-on-Substrate structure, in one embodiment.

Figure 8A:
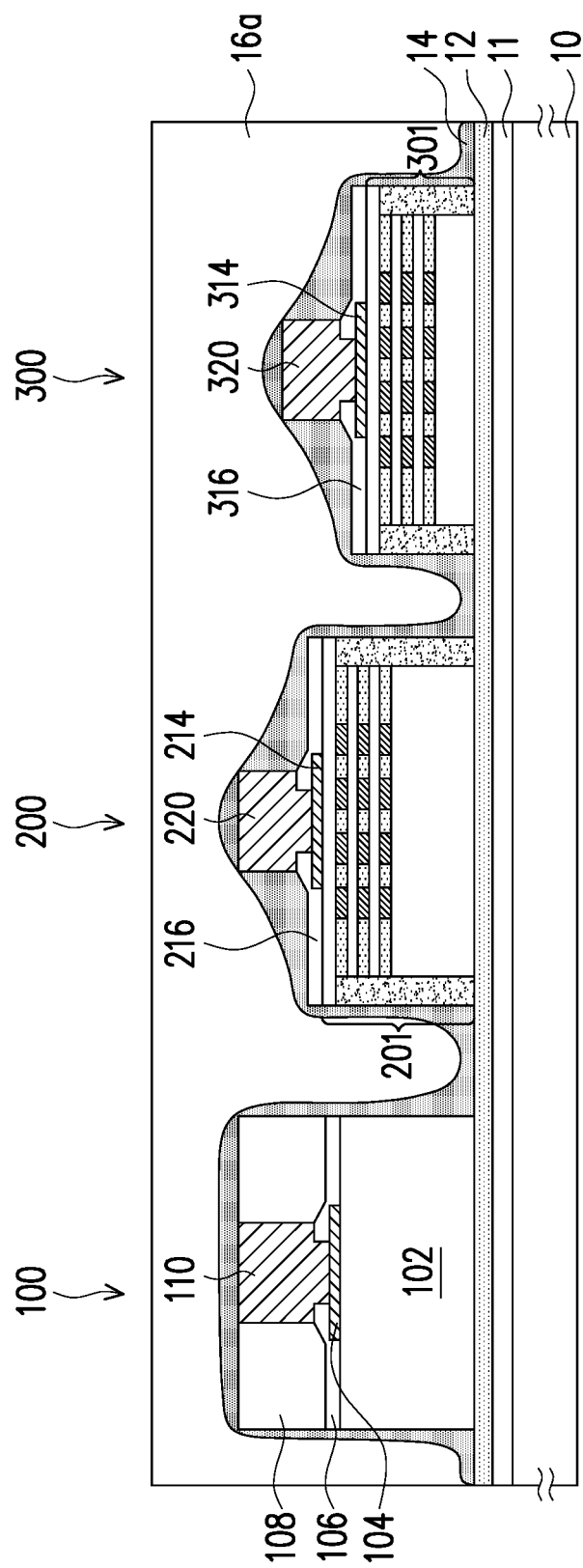
FIG. 8A to FIG. 8C are schematic cross-sectional views illustrating a method of forming a package structure according to a fourth embodiment of the disclosure.
Figure 8B:
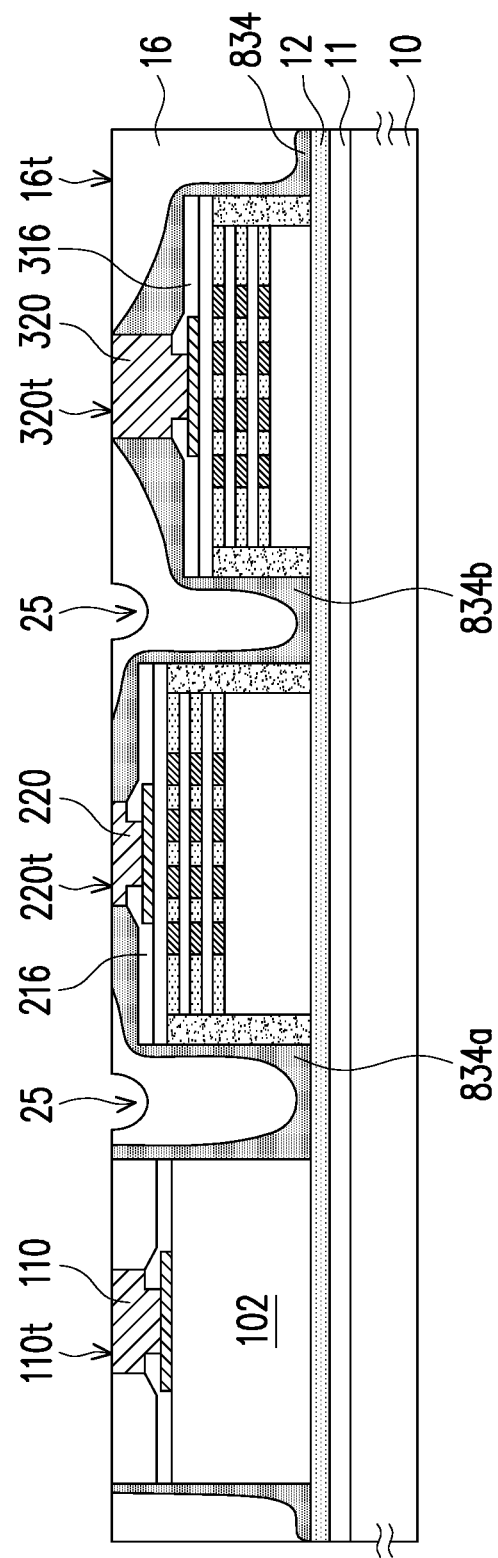
Figure 8C:
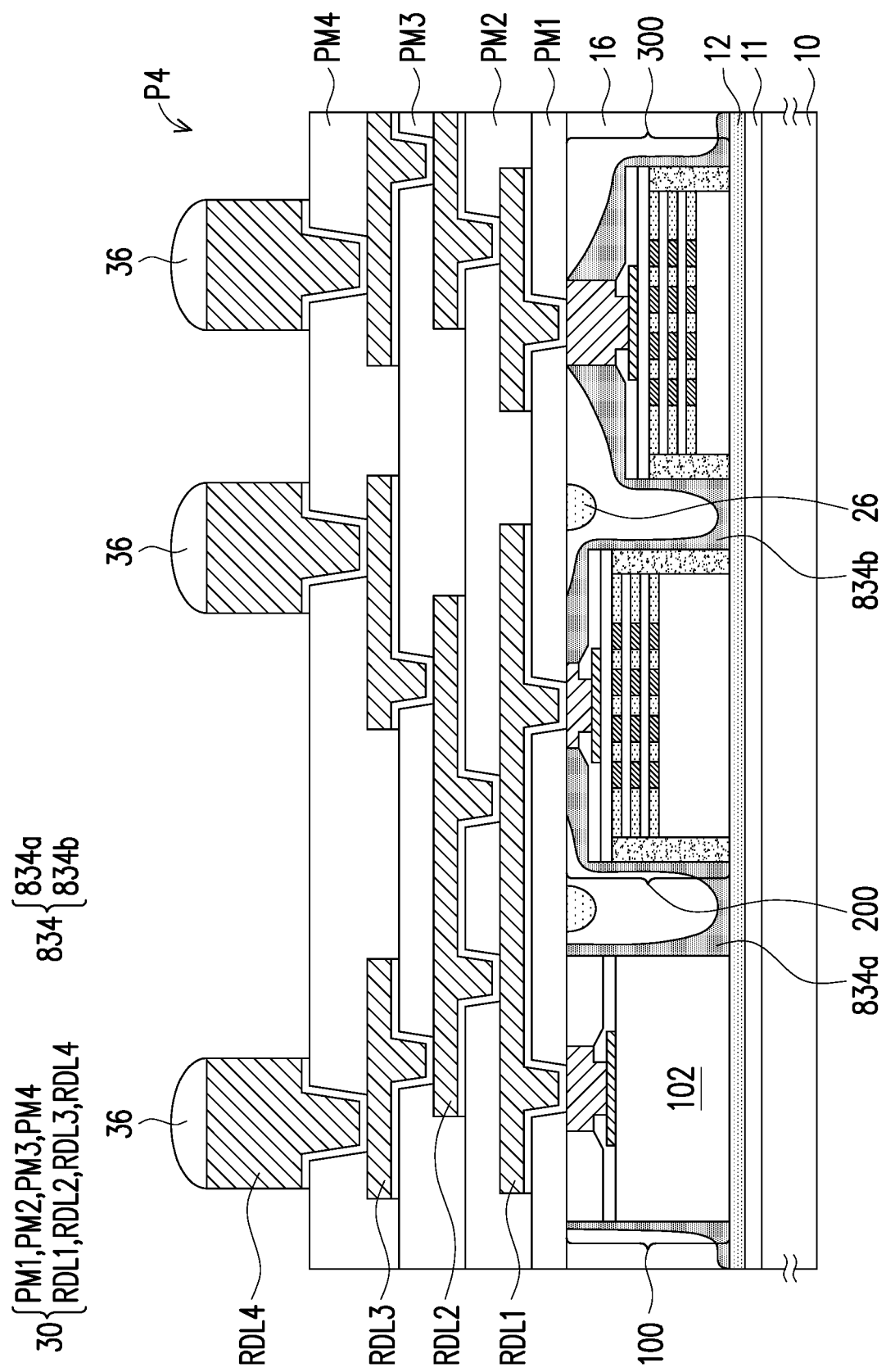

FIG. 8A to FIG. 8C are schematic cross-sectional views illustrating a method of forming a package structure according to a fourth embodiment of the disclosure.

FIG. 8A illustrates forming an encapsulant material layer 16a on the structure illustrated in FIG. 1B by a suitable fabrication technique. The encapsulant material layer 16a encapsulates the first die 100, the second die 200, and the third die 300 and further covers the buffer material 14. The structures, materials, and processes may be similar to what are shown in, and discussed referring to, FIG. 1B and FIG. 1D. The details are thus no repeated herein.

Referring to FIG. 8A and FIG. 8B, a third planarization process is performed to remove the encapsulant material layer 16a and the buffer material 14 over the first die 100, the second die 200, and the third die 300 until the lowest connector 320 is revealed, and an encapsulant 16 is formed. The third planarization process includes a polishing or grinding process, such as a CMP process. In some embodiments, a top surface 16t of the encapsulant 16 is substantially coplanar with a top surface 110t of the connector 110, a top surface 220t of the connector 220, and a top surface 320t of the connector 320.

As shown in FIG. 8B, the buffer material 14 is further grinded to form a buffer layer 834 on the sidewalls of the first die 100, the sidewalls of the second die 200, and the sidewall of the third die 300. In detail, the buffer layer 834a continuously extends from the sidewall of the first die 100 to cover a portion of the top surface of the adhesive layer 12 and the sidewall of the second die 200 adjacent to the first die 100. The buffer layer 834a further extends to cover one side of the top surface of the passivation layer 216 and the sidewall of the connector 220 adjacent to the first die 100. Similarly, the buffer layer 834b also extends from the sidewall of the second die 200 to cover another portion of the top surface of the adhesive layer 12 and the sidewall of the third die 300 adjacent to the second die 200. The buffer layer 834b further extends to cover another side of the top surface of the passivation layer 216 adjacent to the third die 300, a side of the top surface of the passivation layer 316, and the sidewall of the connector 320 adjacent to the second die 200. In addition, one or more pits (or referred as recesses) 25 may be formed in the encapsulant 16 after the third planarization process, in some embodiments. It should be noted that, in the present embodiment, the buffer material 14 may be the non-photosensitive material since the exposure and development processes are not performed in the foregoing steps. Accordingly, the process steps are simplified, thereby saving fabrication costs.

Referring to FIGS. 8B and 8C, after forming the buffer layer 834, the steps illustrated in FIG. 1F to FIG. 1J are performed, so as to form the insulating layers 26 in the encapsulant 16, form the RDL structure 30 on the encapsulant 16, and form the connectors 36 on the redistribution layer RDL4 of the RDL structure 30. The structures, materials, and processes may be similar to what are shown in, and discussed referring to, FIG. 1F to FIG. 1J. The details are thus no repeated herein.

After forming the connectors 36, the carrier 10 may be released with the de-bonding layer 11 decomposed under the heat of light, so as to accomplish a package structure P4. In some embodiments, the adhesive layer 12 may be optionally removed or remained. Thereafter, the package structure P4 may be bonded to a circuit substrate by the connectors 36, so as to form an InFO-on-Substrate structure, in one embodiment.

Figure 9A:
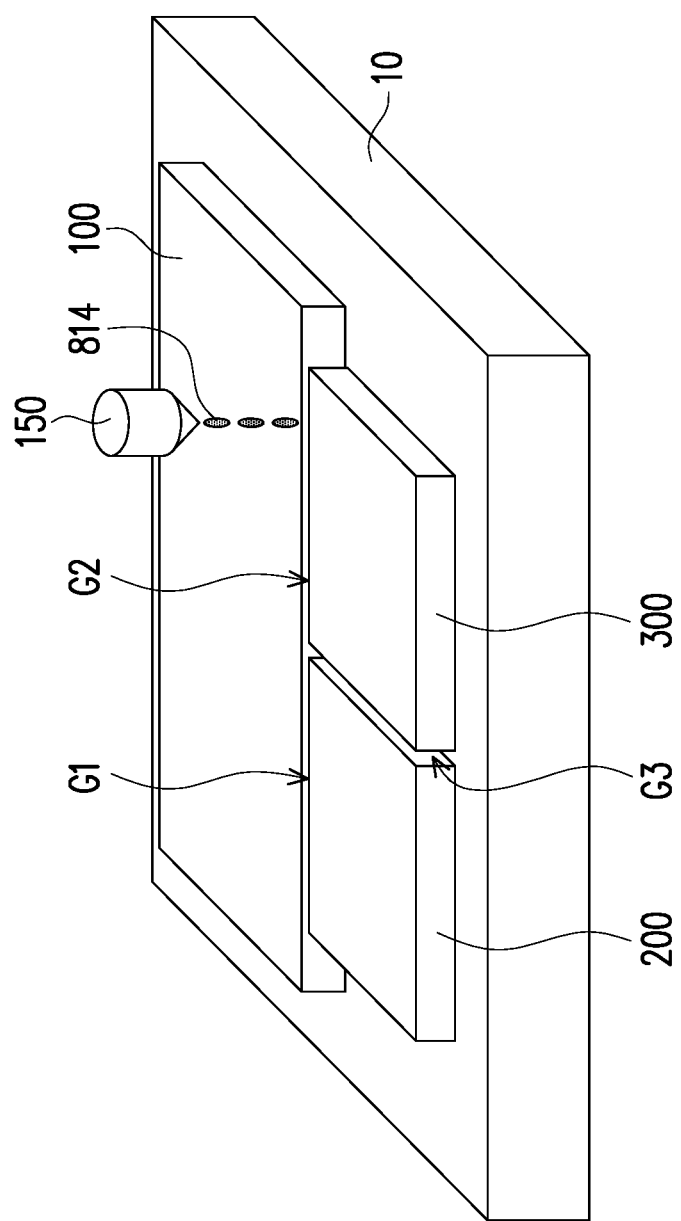
FIG. 9A to FIG. 9C are schematic perspective views illustrating a method of forming a package structure according to a fifth embodiment of the disclosure.
Figure 9B:
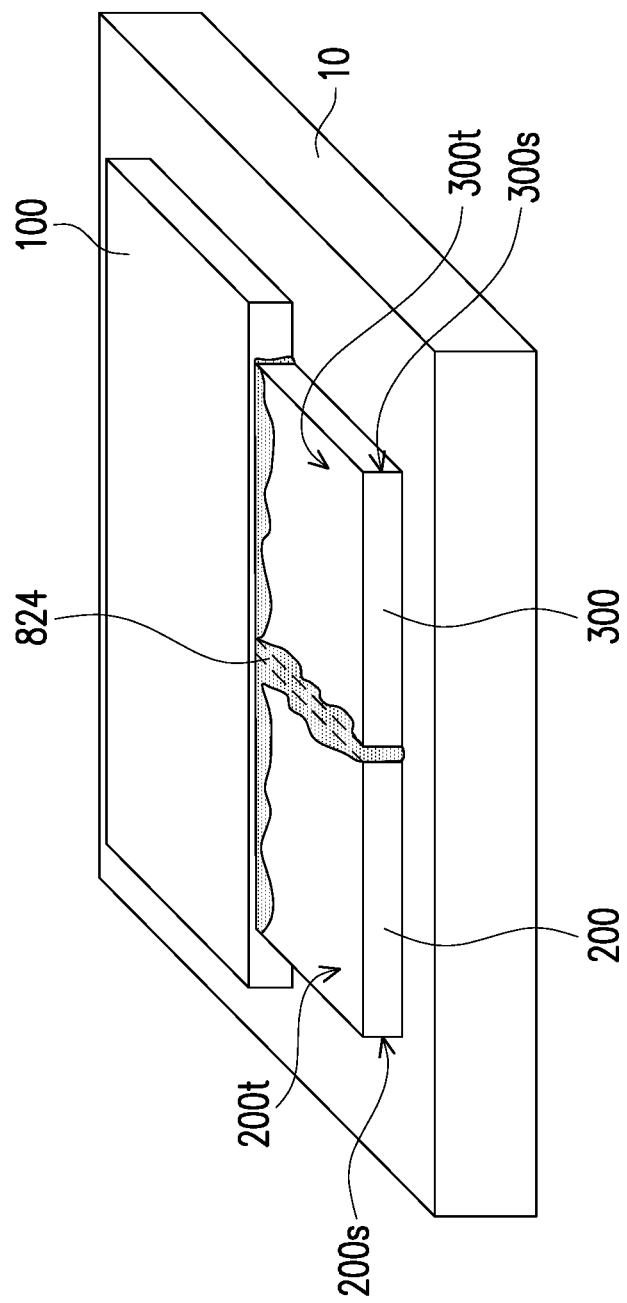
Figure 9C:
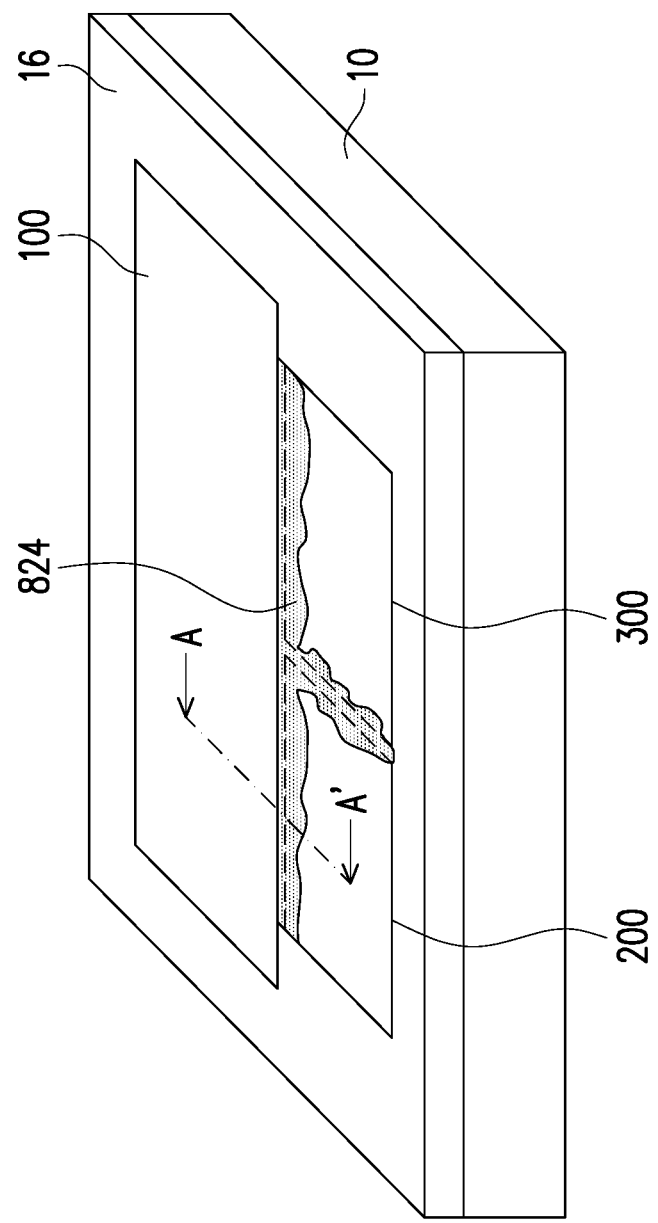
Figure 9D:
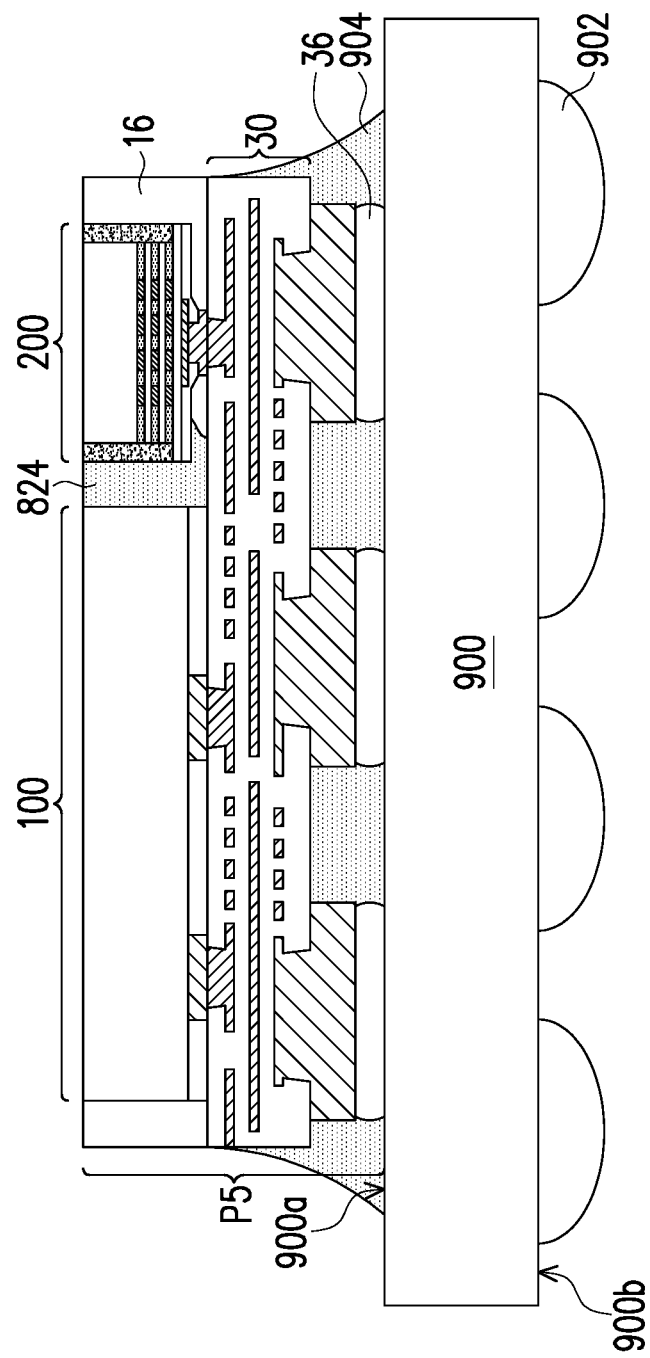
FIG. 9D is a schematic cross-sectional view illustrating a package structure according to a sixth embodiment of the disclosure.
Figure 10:
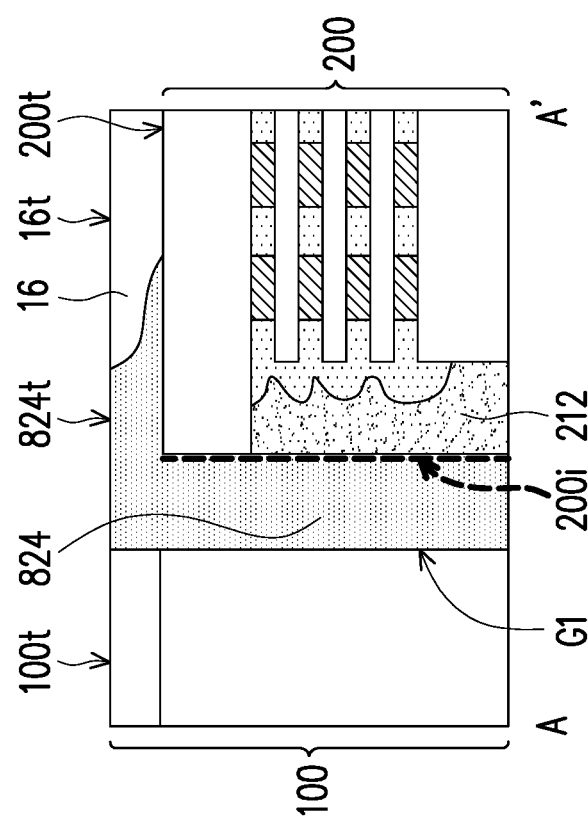
FIG. 10 to FIG. 12 are schematic cross-sectional views taken along the line A-A' of FIG. 9C according to various embodiments of the disclosure.
Figure 11:
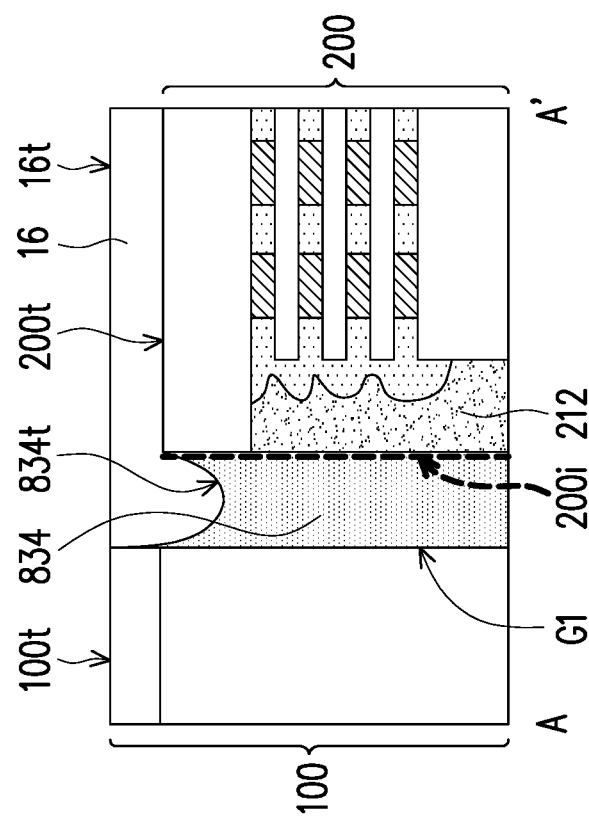
Figure 12:
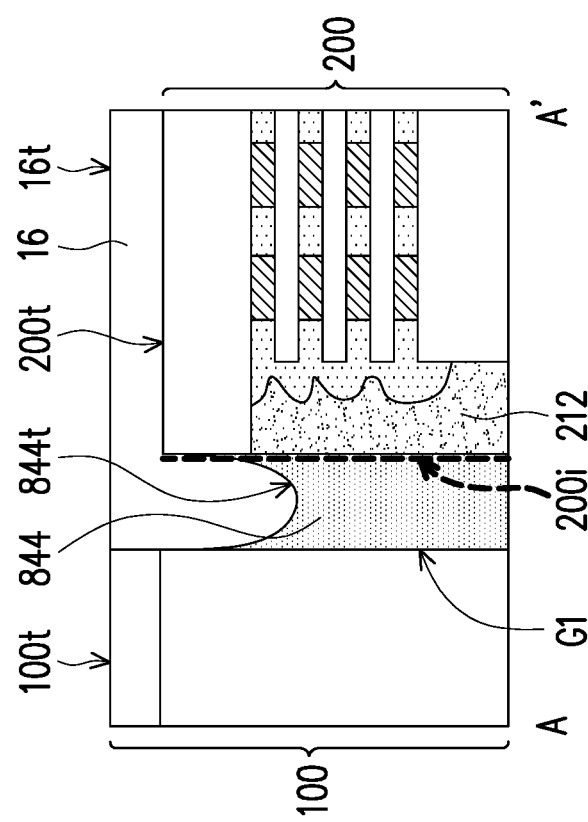

FIG. 9A to FIG. 9C are schematic perspective views illustrating a method of forming a package structure according to a fifth embodiment of the disclosure. FIG. 9D is a schematic cross-sectional view illustrating a package structure according to a sixth embodiment of the disclosure. FIG. 10 to FIG. 12 are schematic cross-sectional views taken along the line A-A' of FIG. 9C according to various embodiments of the disclosure.

Referring to FIG. 9A, a first die 100, a second die 200, and a third die 300 are mounted side by side and spaced apart from one another onto a carrier 10. The arrangement, material and forming method of the first die 100, the second die, and the third die 300 are similar to the arrangement, material and forming method of the structure illustrated in FIG. 1A and FIG. 3 and has been described in detail in the above embodiments. Thus, details thereof are omitted here.

Thereafter, a buffer material 814 is dispensed or filled into a first gap G1 between the first die 100 and the second die 200, a second gap G2 between the first die 100 and the third die 300, and a third gap G3 between the second die 200 and the third die 300 by using a dispenser 150. In some embodiments, the buffer material 814 may include an underfill, a polymer with or without fillers dispersed therein, or the like. In the present embodiment, the buffer material 814 is the underfill including an epoxy-based resin with fillers dispersed therein. The fillers may include insulating fibers, insulating particles, other suitable elements, or a combination thereof. The particle size of the fillers may less than the width of gaps G1, G2, and G3, so as to ease fill in the gaps G1, G2, and G3. Herein, the particle size is referred to the average particle size D50. In alternative embodiments, a width of the first gap G1 may be 20 μm to 500 μm, a width of the second gap G2 may be 20 μm to 500 μm, and a width of the third gap G3 may be 100 μm to 2000 μm.

Referring to FIG. 9A and FIG. 9B, after dispensing the buffer material 814, a curing step is performed on the buffer material 814, so as to form a buffer layer 824 in the gaps G1, G2, and G3. In the present embodiment, as shown in FIG. 9B, the buffer material 814 may overflow from the gaps G1, G2, and G3, thus the formed buffer layer 824 completely fills up the gaps G1, G2, and G3 and further extends to cover portions of top surfaces 200t, 300t of the second and third dies 200, 300. In some embodiments, the curing step may include heating the buffer material 814 to a predetermined temperature for a predetermined period of time, by using an anneal process or other heating process. A temperature of the curing step may be 100° C. to 250° C., and a process time of the curing step may be 30 minutes to 360 minutes. In some alternative embodiments, the curing step may include an ultra-violet (UV) light exposure process, an infrared (IR) energy exposure process, combinations thereof, or a combination thereof with a heating process. Alternatively, the buffer material 814 may be cured by using other methods.

In some embodiments, the buffer layer 824 may protrudes from the gaps G1, G2, and G3 and beyond the sidewalls 200s, 300s of the second die 200 and the third die 300. In some alternative embodiments, the buffer layer 824 may be aligned with or dent from the sidewalls 200s, 300s of the second die 200 and the third die 300.

After the curing step, as shown in FIG. 9C, an encapsulant material layer (not shown) is formed on the carrier 10, the first die 100, the second die 200, and the third die 300. A planarization process is performed to remove the encapsulant material layer over the first die 100, the second die 200, and the third die 300, and an encapsulant 16 is formed. The structures, materials, and processes may be similar to what are shown in, and discussed referring to, FIG. 1D and FIG. 1E. The details are thus no repeated herein. In some alternative embodiments, the buffer material 814 and the encapsulant material layer may be cured in a single curing step, so as to form the buffer layer 824 and the encapsulant 16 simultaneously.

As shown in FIG. 10, the buffer layer 824 completely fills up the first gap G1 and further extends to cover the portion of the top surface 200t of the second die 200. That is, the buffer layer 824 may be in contact with the encapsulant 16 (directly) on the top surface 200t of the second die 200. In the case, the buffer layer 824 has a substantially flat top surface 824t coplanar with a top surface 100t of the first die 100 and the top surface 16t of the encapsulant 16. Similarly, the buffer layer 824 also completely fills up the second gap G2 and further extends to cover the portion of top surface 300t of the third die 200 (not shown). It should be noted that the buffer layer 824 can protect the second and third dies 200 and 300 from damage during the planarization process or the following reliability tests. In detail, the buffer layer 824 has a Young's modulus less than a Young's modulus of the encapsulant 16 and a Young's modulus of the encapsulant 212. That is, the buffer 824 is softer or more elastic than the encapsulants 16 and 212. Accordingly, the buffer layer 824 disposed between the encapsulants 16 and 212 is able to release or reduce a thermal stress resulted from the CTE mismatch. In the case, the buffer layers 824 is able to improve an adhesion between an interface 200i between the encapsulants 16 and 212, so as to avoid the crack or delamination issue thereby enhancing the yield and the reliability. In some embodiments, the buffer layer 824 has a CTE greater than a CTE of the encapsulant 16 and a CTE of the encapsulant 212. In another embodiment, a filler content and/or a filler size of the buffer layer 824 may be less than a filler content and/or a filler size of the encapsulant 16 and a filler content and/or a filler size of the encapsulant 212. Herein, the filler size is referred to the average particle size D50. In alternative embodiments, the buffer layer 824 has an elongation greater than an elongation of the encapsulant 16 and an elongation of the encapsulant 212.

In other embodiments, as show in FIG. 11, the buffer layer 834 has a concave top surface 834t lower than the top surface 100t of the first die 100 and the top surface 16t of the encapsulant 16 depending on the dispensing amount. In the case, the encapsulant 16 covers the top surface 200t of the second die 200 and further cover the concave top surface 834t of the buffer layer 834. That is, the encapsulant 16 may be in contact with the buffer layer 834 in the first gap G1. In alternative embodiments, the buffer layer 844 has a concave top surface 844t lower than the top surface 834t of the buffer layer 834, as shown in FIG. 12. In the case, the encapsulant 16 further cover and contact the sidewall of the second die 200.

Referring back to FIG. 9C and FIG. 9D, after forming the encapsulant 16, the steps illustrated in FIG. 1H to FIG. 1J are performed, so as to form the RDL structure 30 on the encapsulant 16, and form the connectors 36 on the redistribution layer RDL4 of the RDL structure 30. The structures, materials, and processes may be similar to what are shown in, and discussed referring to, FIG. 1H to FIG. 1J. The details are thus no repeated herein.

After forming the connectors 36, the carrier 10 may be released to accomplish a package structure P5, as shown in FIG. 9D. Thereafter, the package structure P5 may be bonded to a circuit substrate 900 by the connectors 36, so as to form an InFO-on-Substrate structure. In some embodiments, the circuit substrate 900 may include a package substrate, such as a build-up substrate including a core therein, a laminate substrate including a plurality of laminated dielectric films, a PCB, or the like. The circuit substrate 900 may include electrical connectors 902, such as solder balls, disposed on a bottom surface 900b of the circuit substrate 900 to allow the circuit substrate 900 to be mounted to another device. In addition, an encapsulant 904 may be optionally dispensed between the package structure P5 and the circuit substrate 900 and laterally encapsulating the connectors 36. In some embodiments, the encapsulant 904 may cover a portion of a top surface 900a of the circuit substrate 900 and further covers the sidewalls of the RDL structure 30, as shown in FIG. 9D. The encapsulant 904 may be any acceptable material, such as a polymer, epoxy, molded underfill, or the like. In some embodiments, the connectors 902 may include C4 bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. In some alternative embodiments, a size (e.g., a width) of the connectors 902 may be greater than a size (e.g., a width) of the connectors 36.

In the embodiments of the disclosure, a package structure includes a first die, a second die, a first encapsulant, and a buffer layer. The first die and the second die are disposed side by side. The first encapsulant encapsulates the first die and the second die. The second die includes a die stack encapsulated by a second encapsulant. The buffer layer extends continuously between the first and second dies and covers facing sidewalls of the first and second dies.

In accordance with some embodiments of the disclosure, a method of forming a package structure includes: mounting a first die and a second die on a carrier; forming a buffer material to conformally cover the first die and the second die; performing an exposure process on the buffer material by using a mask with an opening corresponding to the second die, wherein the opening comprises a frame shape surrounding a perimeter of the second die; and performing a developing process to remove a portion of the buffer material to form a buffer layer that extends continuously from a sidewall of the second die to cover a sidewall of the first die adjacent to the second die; and forming a first encapsulant encapsulating the first die and the second die, wherein the second die has a second encapsulant encapsulating a die stack, the buffer layer is formed between the first encapsulant and the second encapsulant, and the buffer layer has a Young's modulus less than a Young's modulus of the first encapsulant and a Young's modulus of the second encapsulant.

In accordance with alternative embodiments of the disclosure, a method of forming a package structure includes: mounting a first die and a second die on a carrier; forming a buffer material to conformally cover the first die and the second die; forming an encapsulant material layer on the buffer material; and performing a first planarization process to remove the encapsulant material layer and the buffer material over the first die and the second die, so as to form a first encapsulant and a buffer layer in a single process, wherein the buffer layer extends continuously from a sidewall of the second die to cover a sidewall of the first die adjacent to the second die and further covers a corner of the second die, a top surface of a passivation layer of the second die, and a sidewall of a connector of the second die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a first die, a second die, and a third die, disposed side by side and spaced apart from one another;
    a buffer layer, disposed in a first gap between the first die and the second die, disposed in a second gap between the first die and the third die, and disposed in a third gap between the second die and the third die;
    a first encapsulant encapsulating the first die, the second die, the third die, and the buffer layer, wherein the second die includes a first die stack encapsulated by a second encapsulant and the third die includes a second die stack encapsulated by a third encapsulant; and
    a redistribution layer (RDL) structure disposed on the first die, the second die, third die, and the first encapsulant, wherein the buffer layer fills into the first gap, the second gap, and the third gap and further extends to cover portions of top surfaces of the second and third dies, wherein an interface between the buffer layer and the first encapsulant extends from the top surface of the second die to the RDL structure.

2. The package structure of claim 1, wherein the buffer layer has a Young's modulus less than a Young's modulus of the first encapsulant, a Young's modulus of the second encapsulant, and a Young's modulus of the third encapsulant.

3. The package structure of claim 1, wherein the buffer layer has a substantially flat top surface coplanar with a top surface of the first die.

4. The package structure of claim 1, wherein the top surface of the second die is lower than a top surface of the first die.

5. The package structure of claim 1, wherein the buffer layer has a substantially flat top surface higher than the top surfaces of the second and third dies.

6. The package structure of claim 1, wherein the buffer layer has a substantially flat top surface coplanar with a top surface of the first encapsulant.

7. The package structure of claim 1, further comprising:
    a circuit substrate bonded to the RDL structure through a plurality of conductive terminals, wherein the plurality of conductive terminals are electrically connected to the first die, the second die, third die through the RDL structure.

8. The package structure of claim 1, further comprising: a plurality of filling structures, embedded in the first encapsulant and sandwiched between the first encapsulant and the RDL structure.

9. The package structure of claim 8, wherein the plurality of filling structures are electrically insulating and extend from an interface between the first encapsulant and the RDL structure partially into the first encapsulant.

10. A method of forming a package structure, comprising:
    mounting a first die and a second die on a carrier;

dispensing a buffer material in a gap between the first die and the second die;

curing the buffer material to form a buffer layer filled in the gap between the first die and the second die;

forming a first encapsulant encapsulating the first die, the second die, and the buffer layer between the first and second dies, wherein the second die has a first die stack and a second encapsulant encapsulating the first die stack, and the buffer layer has a Young's modulus less than a Young's modulus of the first encapsulant and a Young's modulus of the second encapsulant, and the buffer layer fills into the gap between the first die and the second die and further extends to cover a portion of a top surface of the second die, wherein the buffer layer is formed to have a substantially flat top surface coplanar with a top surface of the first die.

11. The method of claim 10, wherein the mounting the first die and the second die on the carrier further comprises mounting a third die on the carrier, wherein the third die has a height less than a height of the second die.

12. The method of claim 11, wherein the third die comprises a second die stack and a third encapsulant encapsulating the second die stack.

13. The method of claim 12, wherein the Young's modulus of the buffer layer is less than a Young's modulus of the third encapsulant.

14. The method of claim 10, further comprising:

forming a redistribution layer (RDL) structure on the first die, the second die, and the first encapsulant; and bonding a circuit substrate to the RDL structure through a plurality of conductive terminals, wherein the plurality of conductive terminals are electrically connected to the first die and the second die.

15. The method of claim 10, wherein the buffer layer is in contact with the first encapsulant on the top surface of the second die.

16. The method of claim 10, wherein the top surface of the second die is lower than the top surface of the first die.

17. A package structure, comprising:

a first die, a second die, and a third die, disposed side by side and spaced apart from one another;

a buffer layer, disposed in a first gap between the first die and the second die, disposed in a second gap between the first die and the third die, and disposed in a third gap between the second die and the third die;

a first encapsulant encapsulating the first die, the second die, the third die, and the buffer layer;

a redistribution layer (RDL) structure disposed on the first die, the second die, third die, and the first encapsulant; and a circuit substrate bonded to the RDL structure through a plurality of conductive terminals, wherein a plurality of filling structures are embedded in the first encapsulant and sandwiched between the first encapsulant and the RDL structure, and the plurality of filling structures are electrically insulating and extend from an interface between the first encapsulant and the RDL structure partially into the first encapsulant.

18. The package structure of claim 17, wherein the buffer layer fills into the first gap, the second gap, and the third gap and further extends to cover portions of top surfaces of the second and third dies.

19. The package structure of claim 18, wherein the buffer layer has a substantially flat top surface coplanar with a top surface of the first die.

20. The package structure of claim 17, wherein the buffer layer has a concave top surface lower than a top surface of the first die.

* * * * *